United States Patent
Hirose et al.

(10) Patent No.: US 7,183,009 B2
(45) Date of Patent: *Feb. 27, 2007

(54) ORGANIC ELECTROLUMINESCENT ELEMENT

(75) Inventors: Hidekazu Hirose, Minamiashigara (JP); Mieko Seki, Minamiashigara (JP); Hirohito Yoneyama, Minamiashigara (JP); Daisuke Okuda, Minamiashigara (JP); Tadayoshi Ozaki, Minamiashigara (JP); Takeshi Agata, Minamiashigara (JP); Toru Ishii, Minamiashigara (JP); Kiyokazu Mashimo, Minamiashigara (JP); Katsuhiro Sato, Minamiashigara (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/377,672

(22) Filed: Mar. 4, 2003

(65) Prior Publication Data
US 2004/0018384 A1  Jan. 29, 2004

(30) Foreign Application Priority Data
Mar. 6, 2002  (JP)  .............................. 2002-060558

(51) Int. Cl.
H05B 33/12 (2006.01)
H01L 51/50 (2006.01)

(52) U.S. Cl. .................. 428/690; 428/917; 313/504; 313/506; 257/40

(58) Field of Classification Search ................ 428/690, 428/917; 313/504, 506; 257/40
See application file for complete search history.

(56) References Cited

U.S. PATENT DOCUMENTS 4,539,507 A  9/1985  VanSlyke et al.

(Continued)

FOREIGN PATENT DOCUMENTS

EP  0710893 A1 *  5/1996

(Continued)

OTHER PUBLICATIONS

Bayerl et al., Macromol. Rapid Commun., vol. 20, pp. 224-228 (1999).*

(Continued)

*Primary Examiner*—Dawn Garrett
(74) *Attorney, Agent, or Firm*—Fildes & Outland, P.C.

(57) ABSTRACT

Disclosed is an organic electroluminescent element comprising at least one pair of electrodes comprising an anode and a cathode, at least one of which having light permeability, and one or a plurality of organic compound layers held between the electrodes, wherein at least one organic compound layer contains at least one kind of charge-transferable polyether comprising a repetition unit containing at least one partial structure selected from the group consisting of the following general formulae (I-1) and (I-2)

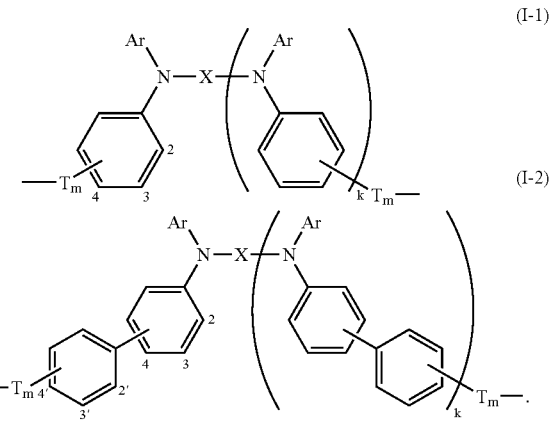

34 Claims, 1 Drawing Sheet

U.S. PATENT DOCUMENTS

| | | | |
|---|---|---|---|
| 5,247,190 | A | 9/1993 | Friend et al. |
| 5,281,489 | A * | 1/1994 | Mori et al. ................. 428/690 |
| 5,414,069 | A | 5/1995 | Cumming et al. |
| 5,604,064 | A | 2/1997 | Nukada et al. |
| 5,639,581 | A * | 6/1997 | Iwasaki et al. ............ 430/58.7 |
| 6,057,048 | A | 5/2000 | Hu et al. |
| 6,096,453 | A | 8/2000 | Grunwald |
| 6,486,601 | B1 | 11/2002 | Sakai et al. |
| 6,537,687 | B1 | 3/2003 | Nii |
| 6,538,263 | B1 | 3/2003 | Park et al. |
| 6,670,052 | B2 * | 12/2003 | Hirose et al. ............... 428/690 |
| 2002/0182440 | A1 | 12/2002 | Seki et al. |
| 2004/0018384 | A1 | 1/2004 | Hirose et al. |

FOREIGN PATENT DOCUMENTS

| | | |
|---|---|---|
| JP | 59-194393 | 11/1984 |
| JP | 10-092576 | 4/1998 |
| JP | 2002-075654 | * 3/2002 |

OTHER PUBLICATIONS

Thelakkat et al., Synthetic Metals, 102 (1999), p. 1125-1128 (no month given).*

Thelakkat et al., Polymer Preprints, (1999), 40(2), p. 1230-1231.*

P.S. Vincett et al., Electrical Conduction and Low Voltage Blue Electroluminescence in Vacuum-Deposited Organic Films, *Thin Solid Films*, 94, 1982, pp. 171-183.

C. W. Tang et al., "Organic Electroluminescent Diodes", *Appl. Phys. Lett.*, vol. 51, Sep. 21, 1987, pp. 913-915.

Pioneer Electronic Corp. et al., "Organic Electroluminescent Devices with a Starburst Amine as Hole Transport Material", The 40th Meeting, Japan Society of Applied Physics & Related Societies Preprints 30a-SZK-14, 1993, p. 1146.

Gustafsson et al., "Flexible Light-Emitting Diodes Made from Soluble Conducting Polymers", *Nature*, vol. 357, Jun. 11, 1992, pp. 477-479.

M. Sugihara et al., "Synthesis and Physical Properties of Polyphosphazenes Having Hole-Transporting Aromatic Tertiary Amines in Side Chains", Polymer Preprints, Japan vol. 42, No. 7, 20J-21 (1993), pp. 2860-2863.

Y. Mori et al., "Light-Emitting Characteristics of Organic Electroluminescent Devices With a Mixed-Layer Structure", The 38th Meeting, Japan Society of Applied Physics & Related Societies, Preprints 31p-G-12 (1991).

Nagoya Univ. Minolta Camera Co., et al., Preparation of Organic Electroluminescent Devices by Casting Method and Their Evaluation (Nagoya Univ. and Minolta Camera), The 50th Meeting, Japan Society of Applied Physics, Preprints 29p-ZP-5 (1989), p. 1006.

Sanyo Electric Co. et al., "Organic EL Devices Having a Cast Polymer Film as a Hole Transport Layer", The 51th Meeting, Japan Society of Applied Physics, Preprints 28a-PB-7 (1990), p. 1041.

Technical Report of IEICE, OME 94-54, 1995, pp. 47-52.

* cited by examiner

ORGANIC ELECTROLUMINESCENT ELEMENT

BACKGROUND OF THE INVENTION

1. Field of the Invention

The present invention relates to an element which converts electric energy into light to emit light, and, particularly, to an organic electroluminescent element which is preferably used in the fields of display elements, back lights, lighting sources, electrophotographic exposure systems, marks, signboards and the like.

2. Description of the Related Art

Electroluminescent elements are spontaneous light emitting all-solid elements, have high visibility and are strong against impacts and are therefore expected to be used in wide applications. At present, electroluminescent elements employing inorganic phosphors are dominantly and widely used. However, these electroluminescent elements are problematic in that the cost of running them is high due to the high a.c. voltage of 200 V or more required to power them, and further, they do not provide sufficient brightness.

Studies on electroluminescent elements using organic compounds were first started using a single crystal such as anthracene. However, the thickness of a film was as thick as about 1 mm, requiring a drive voltage of 100 V or more. For this, an attempt has been made to make a thin film by a vapor deposition method (Thin Solid Films, Vol. 94, 171 (1982)). The emission of light from such an electroluminescent element is a phenomenon that electrons are injected from one of the electrodes of the electroluminescent element and holes are injected from the other electrode, whereby the light emitting material in the electroluminescent element is excited to a higher energy level and then emits excess energy as light when the excited light emitting body is returned to the ground state. However, the drive voltage required is still as high as 30 V and also the densities of electron and hole carriers are low. Therefore, because the probability of photons being created by carrier recombination is low, only insufficient brightness can be obtained and these electroluminescent elements using organic compounds have not been put to practical use.

In the meantime, a function-separating type organic electroluminescent element which was produced by laminating a hole-transferable organic low-molecular compound and a fluorescent organic low-molecular compound having electron-transferability as very thin films in this order on a transparent substrate and ensured a brightness as high as 1000 cd/m$^2$ or more even under a voltage as low as about 10 V was reported by Tang et al., in 1987 (Appl. Phys. Lett., Vol. 51, 913 (1987) and Japanese Patent Application Laid-pen (JP-A) No. 59-194393). Organic electroluminescent elements having a laminate structure have been researched and developed actively since then.

Such an organic electroluminescent element has a structure in which an organic luminous body and a charge-transferable organic material (charge transfer material) are laminated on an electrode, wherein the holes and electrons of each material move in the charge transfer material and are recombined with each other to emit light. As the organic luminous body, organic dyes and the like, such as an 8-quinolinol aluminum complex and cumalin compound, which emit fluorescent light are used. Also, examples of the charge transfer material include diamino compounds such as N, N-di (m-tolyl)-N, N'-diphenylbenzidine and 1, 1-bis[N, N-di(p-tolyl) aminophenyl] cyclohexane and 4-(N, N-diphenyl) aminobenzaldehydo-N, N-diphenylhydrazone compounds.

However, the aforementioned organic electroluminescent elements have high light emitting characteristics but have problems concerning heat stability when light is emitted and preserving stability. The thickness of the organic material layer constituting the above organic electroluminescent element is extremely thin, from several dozen to several hundred nanometers in thickness, and the voltage applied per unit thickness is therefore increased. As a consequence, because the element is driven at a current density as high as several mA/cm$^2$, it generates a large amount of Joule heat. For this, a hole-transferable low-molecular compound and a fluorescent organic low-molecular compound which are formed as films in the form of an amorphous glass state by vapor deposition are gradually crystallized and finally fused, exhibiting deteriorated heat stability. Such deteriorated heat stability causes a reduction in brightness and dielectric breakdown, with the result that such a problem arises that the life of the element is shortened. Also, a change with time when the element is used for a long period of time is effected and a deterioration is caused by an oxygen-containing atmosphere and moisture.

In light of this, in order to solve the problem concerning heat stability, organic electroluminescent elements are reported which use a star burst amine which can provides a hole transfer material in a stable amorphous glass state (The 40th meeting, Japan Society of Applied Physics & Related Societies Preprints 30a-SZK-14 (1993)) or use a polymer in which triphenyl amine is introduced into the side chain of polyphosphazene (The 42nd Polymer meeting, Preprints 20J21 (1993)). However, when each of these elements is used independently, it satisfies neither the ability of injecting holes from an anode nor the ability of injecting holes into a light emitting layer because of the presence of an energy barrier caused by the ionizing potential of the hole transfer material. Also, in the case of the former star burst amine, there is the problem that it has less solubility and thus difficult to refine and therefore difficult to raise the purity. In the case of the latter polymer, there is the problem in that high current density cannot be obtained and the available brightness is therefore insufficient.

On the other hand, the research and development of organic electroluminescent elements having a monolayer structure are being undergone. Elements using a conductive polymer such as poly(p-phenylenevinylene) (for example, Nature, Vol. 357, 477 (1992)) and elements obtained by compounding an electron transfer material and a fluorescent dye in hole-transferable polyvinylcarbazole (The 38th meeting, Japan Society of Applied Physics & Related Societies Preprints 31p-G-12 (1991)) are proposed. However, these elements are far behind laminate type organic electroluminescent elements using an organic low-molecular compound in brightness, luminous efficacy and the like.

Also, it has been reported that as to production methods, a coating system is preferable from the viewpoint of the simplification of production, processability, an increase in area and cost and the element can be obtained also by a casting method (The 50th meeting, Japan Society of Applied Physics, Preprints 29p-ZP-5 (1989) and The 51st meeting, Japan Society of Applied Physics, Preprints 28a-PB-7 (1990)). However, because the charge transfer material is inferior in solubility and compatibility with solvents and resins, it tends to crystallize easily and therefore, from the viewpoint of production, does not possess suitable qualities.

SUMMARY OF THE INVENTION

It is an object of the present invention to solve the aforementioned prior art problem and to attain the following object. More specifically, it is an object of the invention to provide an organic electroluminescent element which is produced using a charge-transferable polyether superior in heat stability when light is emitted and in solubility in and compatibility with solvents and resins, and which has high luminous intensity, luminous efficacy, has long elemental life and is easily produced.

Earnest studies have been made as to a charge transfer polymer to attain the above object and as a result, it has been found that a charge-transferable polyether containing at least one partial structure selected from the group consisting of the following general formulae (I-1) and (I-2) has charge injection characteristics, charge mobility, thin-film formation ability and light emitting characteristics which are suitable for organic electroluminescent elements. The present invention was undertaken and completed with these objectives in mind.

Namely, one aspect of the invention provides an organic electroluminescent element comprising a pair of electrodes consisting of an anode and a cathode, at least one of which having light permeability, and one or a plurality of organic compound layers held between the electrodes, wherein at least one of the organic compound layers contains at least one charge-transferable polyether composed of a repetition unit containing at least one partial structure selected from the group consisting of the following general formulae (I-1) and (I-2).

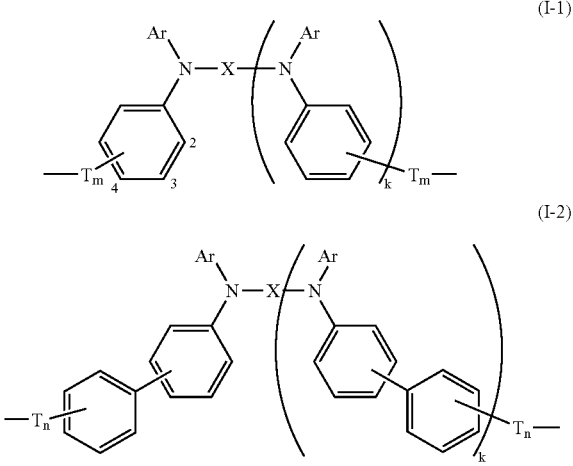

wherein Ar represents a substituted or unsubstituted monovalent benzene ring, a substituted or unsubstituted monovalent polynuclear aromatic hydrocarbon, a substituted or unsubstituted monovalent condensed aromatic hydrocarbon or a substituted or unsubstituted monovalent hetero ring, X represents a substituted or unsubstituted divalent polynuclear aromatic hydrocarbon, a substituted or unsubstituted divalent condensed aromatic hydrocarbon, a substituted or unsubstituted divalent polynuclear hetero group hydrocarbon, a substituted or unsubstituted divalent hetero ring-containing polynuclear aromatic hydrocarbon or a substituted or unsubstituted divalent hetero ring-containing condensed aromatic hydrocarbon, T represents a divalent straight-chain hydrocarbon group having 1 to 6 carbon atoms or a divalent branched hydrocarbon group having 2 to 10 carbon atoms, m denotes an integer from 0 to 3 and k denotes 0 or 1.

Examples of the charge-transferable polyether include polyethers represented by the following general formula (II)

wherein A represents at least one partial structure selected from the group consisting of the above general formulae (I-1) and (I-2), R represents a hydrogen atom, an alkyl group, a substituted or unsubstituted aryl group or a substituted or unsubstituted aralkyl group and p denotes an integer from 3 to 5,000.

The organic compound layer constituting the organic electroluminescent element of the invention has either a monolayer structure formed only by a light emitting layer having charge-transferability or a function-separating type multilayer structure formed by a plurality of layers containing at least a light emitting layer or a light-emitting layer having charge-transferability, said layers having functions that differ reciprocally from each other. Examples of this function-separating type multilayer structure include (1) a light emitting layer and an electron transfer layer (hereinafter abbreviated as "layer structure (1)" as the case may be), (2) a hole transfer layer, a light emitting layer and an electron transfer layer (hereinafter abbreviated as "layer structure (2)" as the case may be) and (3) a hole transfer layer and a light emitting layer having charge-transferability (hereinafter abbreviated as "layer structure (3)" as the case may be). It is to be noted that in the invention, the aforementioned hole transfer layer may be those which functions as a hole injection layer or as a layer produced by laminating a hole injection layer and a hole transfer layer, and the aforementioned electron transfer layer may be those which functions as an electron injection layer or as a layer produced by laminating an electron injection layer and an electron transfer layer.

In the case where the above organic compound layer is constituted only of a light emitting layer having charge-transferability, the light emitting layer having charge-transferability contains a charge-transferable polyether composed of a repetition unit containing at least one partial structure selected from the group consisting of the general formulae (I-1) and (I-2).

In the case where the aforementioned organic compound layer is constituted of function-separating type plural layers, the foregoing charge-transferable polyether is contained in at least one of the light emitting layer and the electron transfer layer in the layer structure (1), the foregoing charge-transferable polyether is contained in at least one of the hole transfer layer and the electron transfer layer in the layer structure (2) and the foregoing charge-transferable polyether is contained in at least one of the hole transfer layer and the light emitting layer having electron-transferability in the layer structure (3).

Also, the above light emitting layer having charge-transferability may further contain a charge-transferable compound (hole transfer materials and electron transfer materials) other than the above charge-transferable polyether.

DESCRIPTION OF THE PREFERRED EMBODIMENTS

Figure 1:
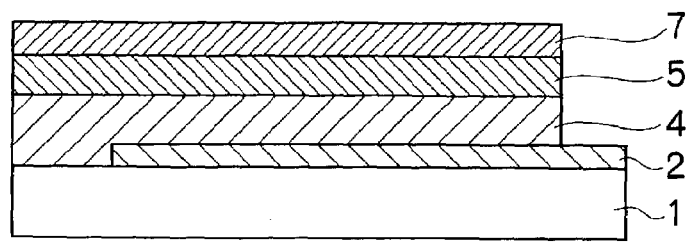
FIG. 1 is a schematic structural view showing one example of the layer structure of an organic electroluminescent element according to the present invention.

An organic electroluminescent element according to the present invention comprises a pair of electrodes consisting of an anode and a cathode, at least one of which is transparent or semitransparent, and one or plural organic compound layers sandwiched between the pair of electrodes, wherein at least one of the organic compound layers contains at least one charge-transferable polyether composed of a repetition unit containing at least one type selected from the structures represented by the following general formulae (I-1) and (I-2) as its partial structure.

This charge-transferable polyether is superior in heat stability when light is emitted and in solubility in and compatibility with solvents and resins. Further, the organic electroluminescent element of the invention contains the organic chemical material layer comprising the aforementioned charge-transferable polyether and therefore has large luminous intensity, high luminous efficacy and long elemental life and also can be easily produced.

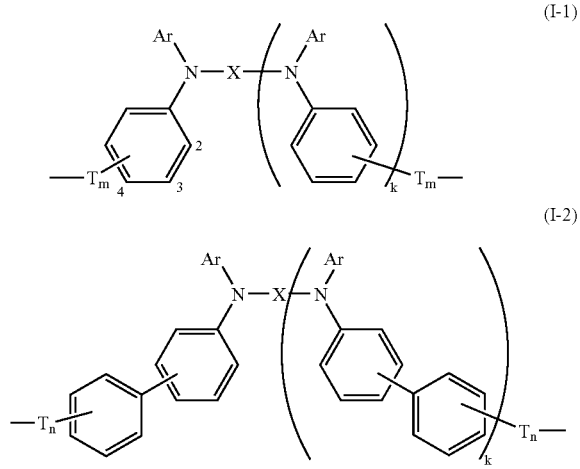

In the general formulae (I-1) and (I-2), Ar represents a substituted or unsubstituted monovalent benzene ring, a substituted or unsubstituted monovalent polynuclear aromatic hydrocarbon, a substituted or unsubstituted monovalent condensed aromatic hydrocarbon or a substituted or unsubstituted monovalent hetero ring, X represents a substituted or unsubstituted divalent polynuclear aromatic hydrocarbon, a substituted or unsubstituted divalent condensed aromatic hydrocarbon, a substituted or unsubstituted divalent polynuclear hetero group hydrocarbon, a substituted or unsubstituted divalent hetero ring-containing polynuclear aromatic hydrocarbon or a substituted or unsubstituted divalent hetero ring-containing condensed aromatic hydrocarbon, T represents a divalent straight-chain hydrocarbon group having 1 to 6 carbon atoms or a divalent branched hydrocarbon group having 2 to 10 carbon atoms, m denotes an integer from 0 to 3 and k denotes 0 or 1.

In the general formulae (I-1) and (I-2), no particular limitation is imposed on the number of the aromatic rings constituting the polynuclear aromatic hydrocarbon and condensed aromatic hydrocarbon selected as the structure representing Ar. However, those having 1 to 3 aromatic rings are preferable. Among the condensed aromatic hydrocarbons, all-condensed aromatic hydrocarbons are preferable. It is to be noted that the polynuclear aromatic hydrocarbon and the condensed aromatic hydrocarbon specifically mean polycyclic aromatics defined hereinbelow in the invention.

Namely, the "polynuclear aromatic hydrocarbon" represents hydrocarbon compounds in which two or more aromatic rings constituted of carbon and hydrogen exist and these aromatic rings are combined among them by a carbon-carbon single bond. Specific examples of the polynuclear aromatic hydrocarbon include biphenyls and terphenyls.

Also, the "condensed aromatic hydrocarbon" represents hydrocarbon compounds in which two or more aromatic rings constituted of carbon and hydrogen exist and these aromatic rings have a pair of neighboring carbon atoms bonded with each other in common among them. Specific examples of the condensed aromatic hydrocarbon include naphthalene, anthracene and phenanthrene and fluorene.

It is also to be noted that condensed aromatic hydrocarbons in which all aromatic rings are continuously neighbored by a condensed cyclic structure are called "all-condensed aromatic hydrocarbons". On the other hand, condensed aromatic hydrocarbons other than these all-condensed aromatic hydrocarbons are called "partially-condensed aromatic hydrocarbons".

As the hetero ring selected as one of the structures representing Ar, those in which the number (Nr) of the atoms constituting each cyclic skeleton is 5 and/or 6 are preferably used. Although there is no particular limitation to the type and number of atoms (heteroatom) other than C constituting the cyclic skeleton, S, N, O or the like, for example, is preferably used and two or more types of and/or two or more heteroatoms may be contained in the aforementioned cyclic skeleton. As, particularly, hetero rings having a five-membered cyclic structure, thiophene, hetero rings obtained by replacing each carbon at the third and fourth positions of thiophene and furan by nitrogen, and hetero rings obtained by replacing each carbon at third and fourth positions of pyrrole with nitrogen are preferably used. Pyridine is preferably used as a hetero ring having a six-membered cyclic structure.

Examples of the substituent of the benzene ring, polynuclear aromatic hydrocarbon, condensed aromatic hydrocarbon or hetero ring selected as the structure representing Ar include a hydrogen atom, alkyl groups, alkoxy groups, aryl groups, aralkyl groups, substituted amino groups and halogen atoms. As the alkyl group, those having 1 to 10 carbon atoms are preferable. Examples of the alkyl group include a methyl group, ethyl group, propyl group and isopropyl group. As the alkoxyl group, those having 1 to 10 carbon atoms are preferable. Examples of the alkoxyl group include a methoxy group, ethoxy group, propoxy group and isopropoxy group. As the aryl group, those having 6 to 20 carbon atoms are preferable. Examples of the aryl group include a phenyl group and tolyl group. As the aralkyl group, those having 7 to 20 carbon atoms are preferable. Examples of the aralkyl group include a benzyl group and phenethyl group. Examples of the substituent of the substituted amino group include an alkyl group, aryl group and aralkyl group. Specific examples of these groups are as mentioned above.

Also, X represents a substituted or unsubstituted divalent polynuclear aromatic hydrocarbon, a substituted or unsubstituted divalent condensed aromatic hydrocarbon, a substituted or unsubstituted divalent polynuclear hetero group hydrocarbon, a substituted or unsubstituted divalent hetero ring-containing polynuclear aromatic hydrocarbon or a substituted or unsubstituted divalent hetero ring-containing condensed aromatic hydrocarbon.

The number of the aromatic rings constituting the above polynuclear aromatic hydrocarbon and condensed aromatic hydrocarbon, is preferably 2 to 6. Also, as the above condensed aromatic hydrocarbon, partially condensed aromatic hydrocarbons are preferably used when the number of aromatic rings is 5 or 6.

Although no particular limitation is imposed on the number of the hetero rings constituting the above polynuclear hetero group hydrocarbon, the number of hetero rings is preferably 2 to 13. Further, a polynuclear hetero group hydrocarbon in which the hetero rings are bonded straight-chain-wise is preferable. Also, the structure of each hetero ring is preferably the same as the hetero ring selected as one of the structures representing the already mentioned Ar.

In the hetero ring-containing polynuclear aromatic hydrocarbon, no particular limitation is imposed on the numbers of individual hetero rings and aromatic rings constituting this aromatic compound. However, hetero ring-containing polynuclear aromatic hydrocarbons are preferable in which the number of hetero rings is 1 to 11, the number of aromatic rings is 2 and an aromatic ring is bonded with each of both terminals of a divalent polynuclear hydrocarbon with which a hetero ring is bonded straight-chain-wise. Also, the structure of each hetero ring is preferably the same as the hetero ring selected as one of the structures representing the already mentioned Ar.

In the hetero ring-containing condensed aromatic hydrocarbon, no particular limitation is imposed on the number of individual hetero rings and aromatic rings constituting this aromatic compound. However, hetero ring-containing condensed aromatic hydrocarbons are preferable in which the number of hetero rings is 1 to 5, the number of aromatic rings is 1 to 5 and at least one or more hetero rings and one or more aromatic rings form a condensed cyclic structure. Also, the structure of each hetero ring is preferably the same as the hetero ring selected as one of the structures representing the already mentioned Ar.

It is to be noted that in the invention, the polynuclear hetero group hydrocarbon, the hetero ring-containing polynuclear aromatic hydrocarbon and the hetero ring-containing condensed aromatic hydrocarbon mean organic compounds having the structures defined as follows.

The "polynuclear hetero group hydrocarbon" means heterocyclic compounds having a structure in which all of the aromatic rings constituting the polynuclear aromatic hydrocarbon are substituted with hetero rings and the number of the hetero rings is 2 or more. The "hetero ring-containing polynuclear aromatic hydrocarbon" means aromatic compounds in which among the aromatic rings constituting the polynuclear aromatic hydrocarbon, a part of the aromatic rings are substituted with hetero rings. The "hetero ring-containing condensed aromatic hydrocarbon" means aromatic compounds in which among the aromatic rings constituting the condensed aromatic hydrocarbon, a part of the aromatic rings are substituted with hetero rings.

As the substituent of the polynuclear aromatic hydrocarbon, condensed aromatic hydrocarbon, polynuclear hetero group hydrocarbon, hetero ring-containing polynuclear aromatic hydrocarbon or hetero ring-containing condensed aromatic hydrocarbon selected as the structure representing X, the same groups as those exemplified as the aforementioned substituent of Ar may be used.

Specific examples of the above X include groups selected from the following general formulae (1) to (8).

(1)

(2)

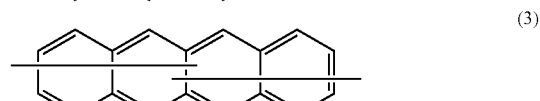

(3)

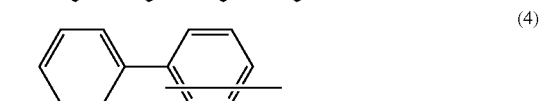

(4)

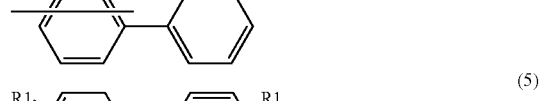

(5)

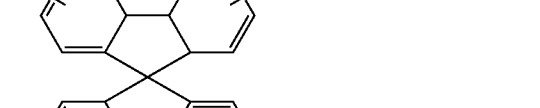

(6)

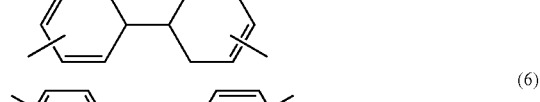

(7)

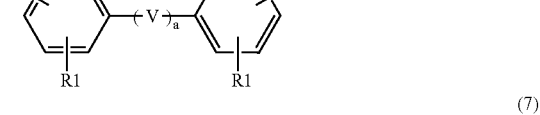

(8)

In the general formulae (5) to (8), $R^1$ represents a hydrogen atom, an alkyl group having 1 to 10 carbon atoms, an alkoxyl group having 1 to 10 carbon atoms, a substituted or unsubstituted phenyl group or a substituted or unsubstituted aralkyl group or a halogen atom, a denotes 0 or 1. V shown in the general formulae (6) and (7) represents a group selected from the following general formulae (9) to (16).

(9)

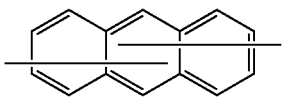 (10)

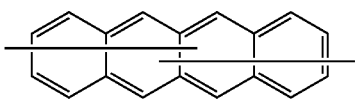 (11)

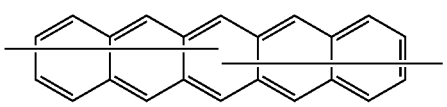 (12)

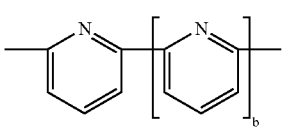 (13)

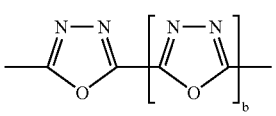 (14)

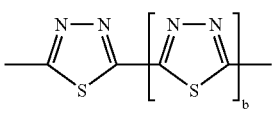 (15)

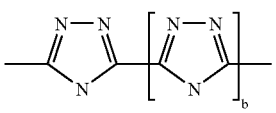 (16)

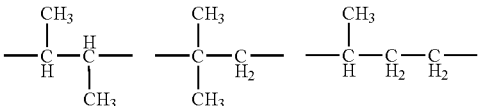

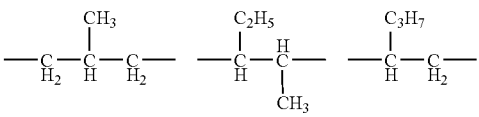

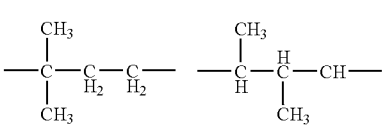

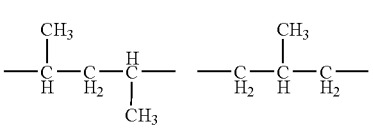

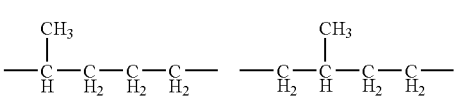

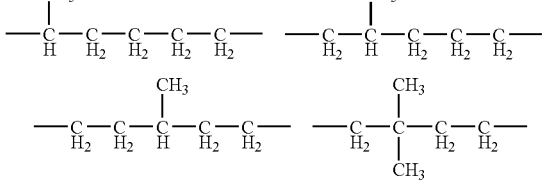

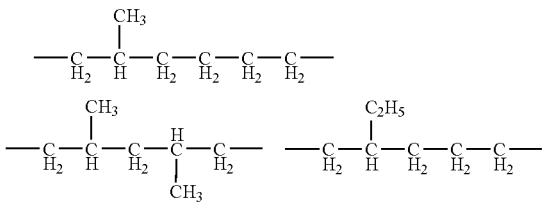

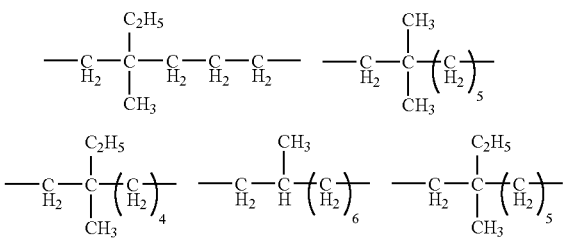

In the general formulae (13) to (16), b denotes an integer from 0 to 10.

In the general formulae (I-1) to (I-2), T represents a divalent straight-chain hydrocarbon group having 1 to 6 carbon atoms or a divalent branched hydrocarbon group having 2 to 10 carbon atoms and is preferably selected from a divalent straight-chain hydrocarbon group having 2 to 6 carbon atoms and a divalent branched hydrocarbon group having 3 to 7 carbon atoms. Specific structures will be shown below.

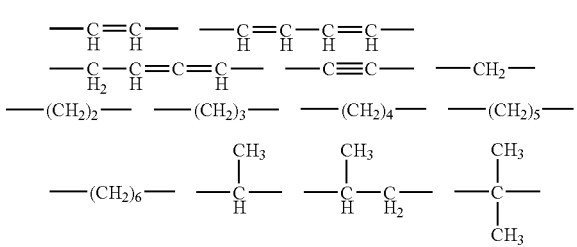

In the general formulae (I-1) and (I-2), m denotes an integer from 0 to 3 and k denotes 0 or 1.

Next, specific examples of the structures represented by the general formula (I-1) are shown in Tables 1 to 17, and specific examples of the structures represented by the general formula (I-2) are shown in Tables 18 to 28. In each structure number shown in Tables 1 to 28, the value of m is not described, but will be described later. Also, in Tables 1 to 28, the substituent represented by "MeO-" means a methoxy group.

TABLE 1
| Structure | K | X | Ar | Bonded position | T |
|---|---|---|---|---|---|
| 1. | 0 | | 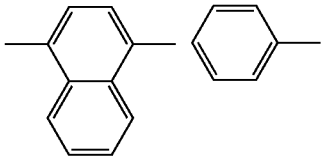 | 3 | —CH$_2$— |
| 2. | 0 | | 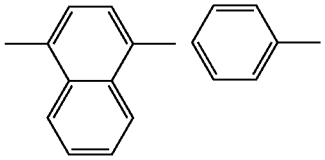 | 3 | —CH$_2$CH$_2$— |
| 3. | 0 | | 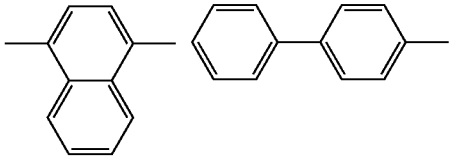 | 3 | —CH$_2$— |
| 4. | 0 | | 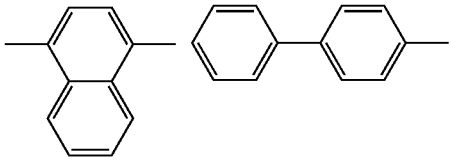 | 3 | —CH$_2$CH$_2$— |
| 5. | 0 | | 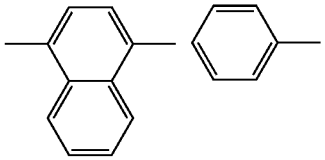 | 4 | —CH$_2$— |
| 6. | 0 | | 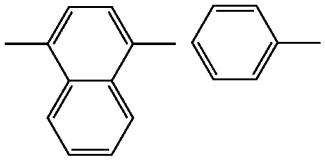 | 4 | —CH$_2$CH$_2$— |
| 7. | 0 | | 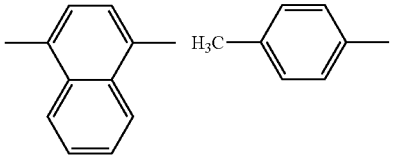 | 4 | —CH$_2$CH$_2$— |
| 8. | 0 | | 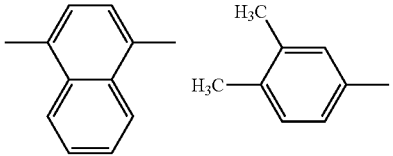 | 4 | —CH$_2$CH$_2$— |

TABLE 2
| Structure | K | X | Ar | Bonded position | T |
|---|---|---|---|---|---|
| 9. | 0 | 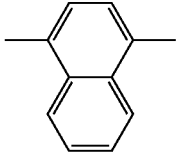 | | 4 | —CH$_2$CH$_2$— |
| 10. | 0 | 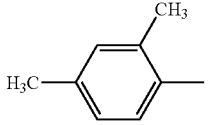 | | 4 | —CH$_2$CH$_2$— |
| 11. | 0 | 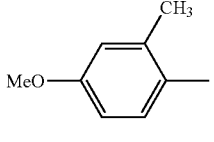 | | 4 | —CH$_2$CH$_2$— |
| 12. | 0 | 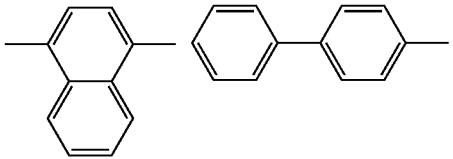 | | 4 | —CH$_2$CH$_2$— |
| 13. | 0 | 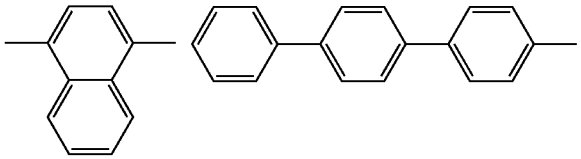 | | 4 | —CH$_2$— |
| 14. | 0 | 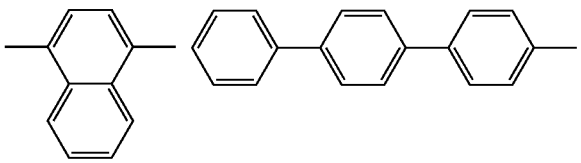 | | 4 | —CH$_2$CH$_2$— |
| 15. | 0 | 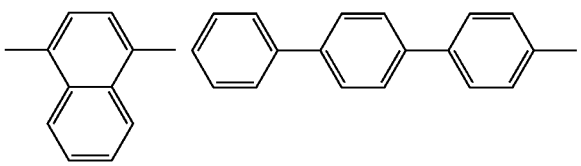 | | 4 | $-\underset{H_2}{C}-\underset{\underset{CH_3}{\overset{CH_3}{\vert}}}{C}-\underset{H_2}{C}-$ |
| 16. | 0 | 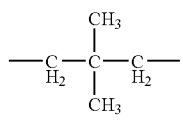 | | 4 | —CH$_2$— |

TABLE 3
| Structure | K | X | Ar | Bonded position | T |
|---|---|---|---|---|---|
| 17. | 0 | 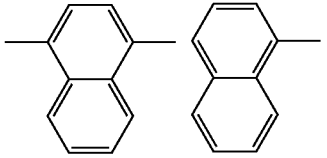 | | 4 | —CH$_2$CH$_2$— |
| 18. | 0 | 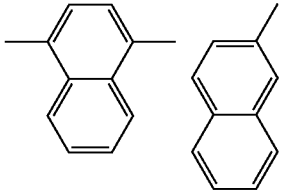 | | 4 | —CH$_2$— |
| 19. | 0 | 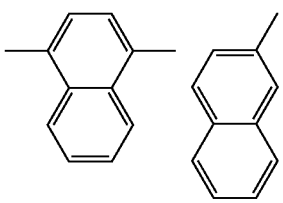 | | 4 | —CH$_2$CH$_2$— |
| 20. | 0 | 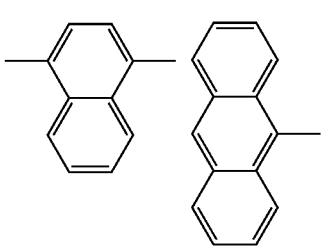 | | 4 | —CH$_2$— |
| 21. | 0 | 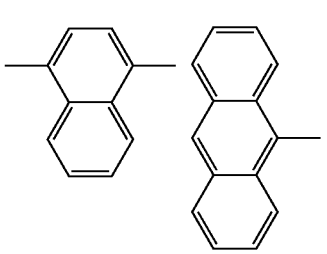 | | 4 | —CH$_2$CH$_2$— |
| 22. | 1 | 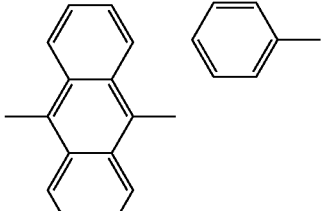 | | 2 | —CH$_2$— |

TABLE 4
| Structure | K | X | Ar | Bonded position | T |
|---|---|---|---|---|---|
| 23. | 1 | 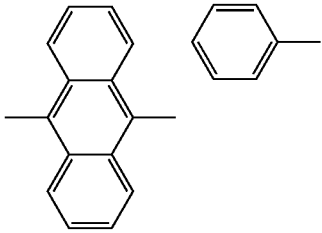 | 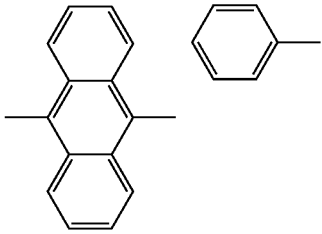 | 3 | —CH$_2$— |
| 24. | 1 | 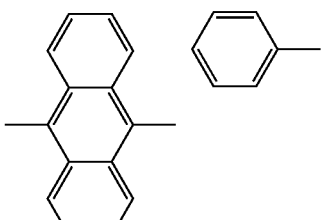 | 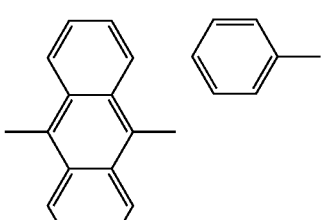 | 4 | —CH$_2$— |
| 25. | 1 | 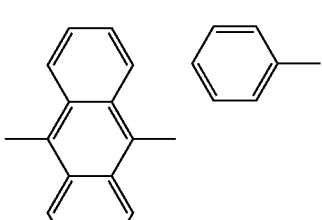 | 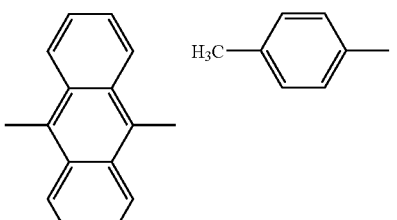 | 2 | —CH$_2$CH$_2$— |
| 26. | 1 | | | 3 | —CH$_2$CH$_2$— |
| 27. | 1 | | | 4 | —CH$_2$CH$_2$— |
| 28. | 1 | | | 4 | —CH$_2$CH$_2$— |

TABLE 4-continued
| Structure | K | X | Ar | Bonded position | T |
|---|---|---|---|---|---|
| 29. | 1 | 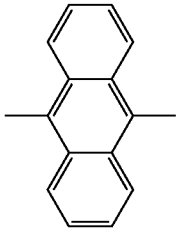 | | 4 | —CH$_2$CH$_2$— |
TABLE 5
| Structure | K | X | Ar | Bonded position | T |
|---|---|---|---|---|---|
| 30. | 1 | | | 4 | —CH$_2$CH$_2$— |
| 31. | 1 | | | 3 | —CH$_2$CH$_2$— |
| 32. | 1 | | | 4 | —CH$_2$CH$_2$— |
| 33. | 1 | | | 3 | —CH$_2$CH$_2$CH$_2$CH$_2$— |
| 34. | 1 | | | 4 | —CH$_2$CH$_2$CH$_2$CH$_2$— |

TABLE 5-continued
| Structure | K | X | Ar | Bonded position | T |
|---|---|---|---|---|---|
| 35. | 1 | 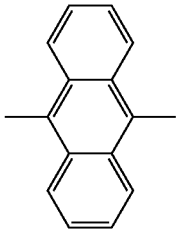 | 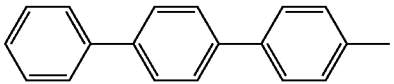 | 4 | 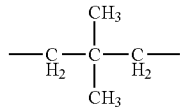 |
| 36. | 1 | 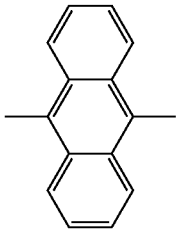 | 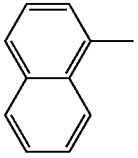 | 4 | —CH$_2$CH$_2$— |
TABLE 6
| Structure | K | X | Ar | Bonded position | T |
|---|---|---|---|---|---|
| 37. | 1 | 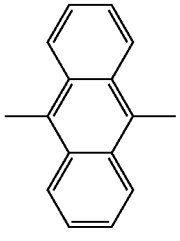 | 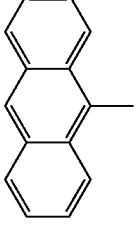 | 4 | —CH$_2$CH$_2$— |
| 38. | 1 | 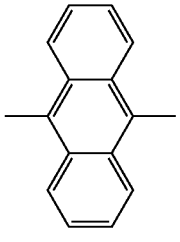 | 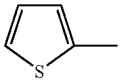 | 4 | —CH$_2$CH$_2$— |
| 39. | 1 | 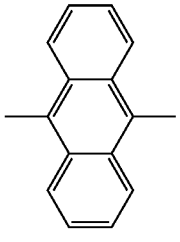 | 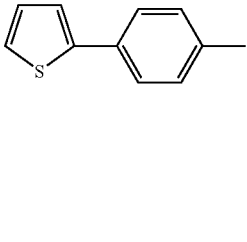 | 4 | —CH$_2$CH$_2$— |
| 40. | 1 | 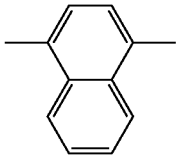 | 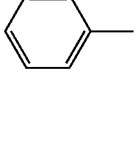 | 3 | —CH$_2$— |

TABLE 6-continued
| Structure | K | X | Ar | Bonded position | T |
|---|---|---|---|---|---|
| 41. | 1 | 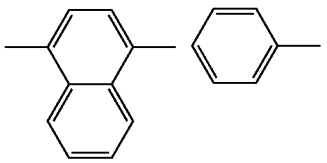 | 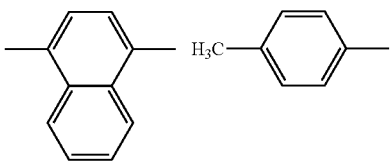 | 4 | —CH$_2$— |
| 42. | 1 | 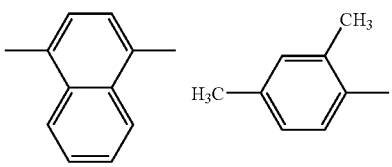 | H$_3$C—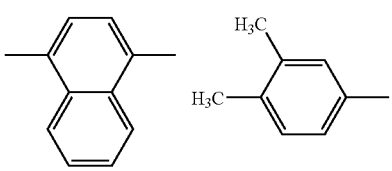 | 4 | —CH$_2$CH$_2$— |
| 43. | 1 | 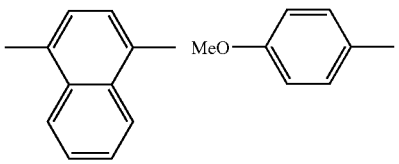 | CH$_3$ H$_3$C—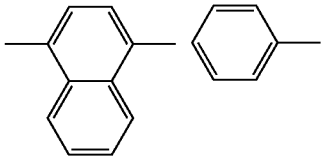 | 4 | —CH$_2$CH$_2$— |
| 44. | 1 | 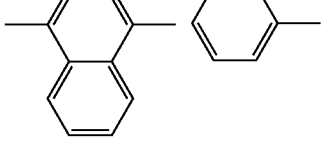 | H$_3$C H$_3$C—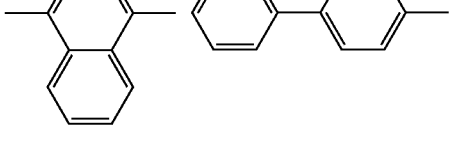 | 4 | —CH$_2$CH$_2$— |
TABLE 7
| Structure | K | X | Ar | Bonded position | T |
|---|---|---|---|---|---|
| 45. | 1 | naphthyl | MeO—phenyl | 4 | —CH$_2$CH$_2$— |
| 46. | 1 | naphthyl | phenyl | 3 | —CH$_2$CH$_2$— |
| 47. | 1 | naphthyl | phenyl | 4 | —CH$_2$CH$_2$— |
| 48. | 1 | naphthyl | biphenyl | 4 | —CH$_2$CH$_2$— |

TABLE 7-continued

| Structure | K | X | Ar | Bonded position | T |
|---|---|---|---|---|---|
| 49. | 1 | naphthalene | biphenyl-phenyl | 4 | —CH$_2$CH$_2$— |
| 50. | 1 | naphthalene | naphthalene | 3 | —CH$_2$— |
| 51. | 1 | naphthalene | naphthalene | 4 | —CH$_2$— |
| 52. | 1 | naphthalene | naphthalene | 3 | —CH$_2$CH$_2$— |

TABLE 8

| Structure | K | X | Ar | Bonded position | T |
|---|---|---|---|---|---|
| 53. | 1 | naphthalene | naphthalene | 4 | —CH$_2$CH$_2$— |
| 54. | 1 | naphthalene | thiophene | 4 | —CH$_2$CH$_2$— |
| 55. | 1 | naphthalene | thiophene-phenyl | 4 | —CH$_2$CH$_2$— |
| 56. | 1 | naphthalene | bithiophene-phenyl | 4 | —CH$_2$CH$_2$— |

TABLE 8-continued
| Structure | K | X | Ar | Bonded position | T |
|---|---|---|---|---|---|
| 57. | 1 | 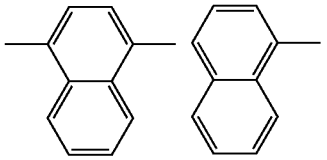 | | 3 | —CH$_2$CH$_2$CH$_2$CH$_2$— |
| 58. | 1 | 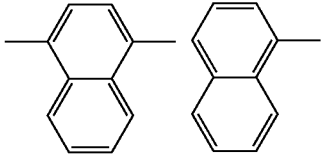 | | 4 | —CH$_2$CH$_2$CH$_2$CH$_2$— |
| 59. | 1 | 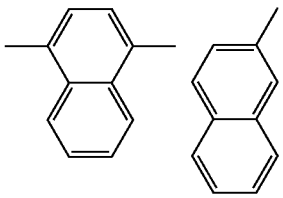 | | 3 | —CH$_2$— |
| 60. | 1 | 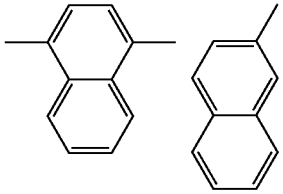 | | 4 | —CH$_2$— |
TABLE 9
| Structure | K | X | Ar | Bonded position | T |
|---|---|---|---|---|---|
| 61. | 1 | 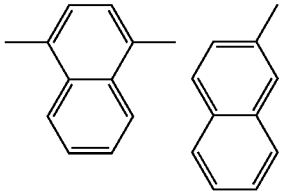 | | 3 | —CH$_2$CH$_2$— |
| 62. | 1 | 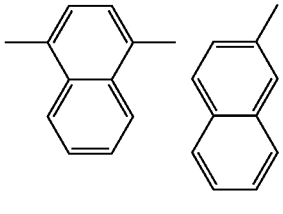 | | 4 | —CH$_2$CH$_2$— |
| 63. | 1 | 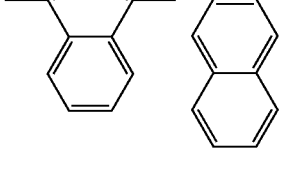 | | 3 | —CH$_2$CH$_2$CH$_2$CH$_2$— |

TABLE 9-continued
| Structure | K | X | Ar | Bonded position | T |
|---|---|---|---|---|---|
| 64. | 1 | 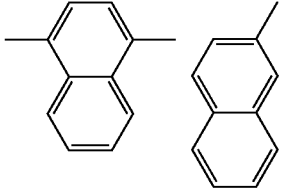 | 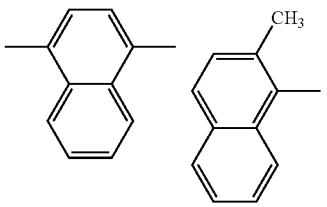 | 4 | —CH$_2$CH$_2$CH$_2$CH$_2$— |
| 65. | 1 | 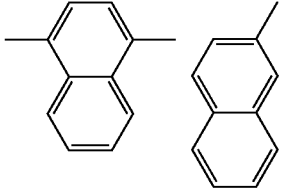 | 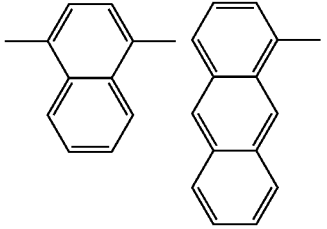 | 4 | —CH$_2$CH$_2$— |
| 66. | 1 | 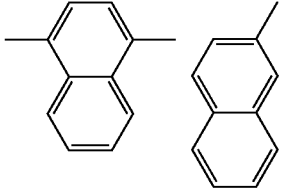 | 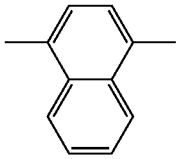 | 4 | —CH$_2$— |
TABLE 10
| Structure | K | X | Ar | Bonded position | T |
|---|---|---|---|---|---|
| 67. | 1 | 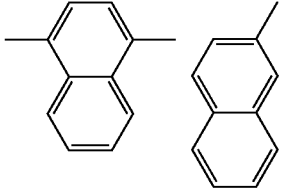 | 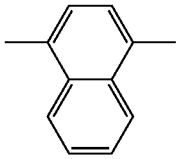 | 4 | —CH$_2$CH$_2$— |
| 68. | 1 | 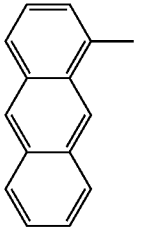 | 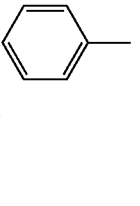 | 3 | —CH$_2$— |
| 69. | 1 | 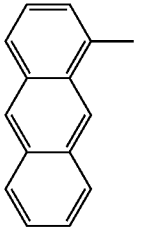 | 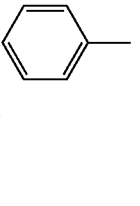 | 4 | —CH$_2$— |

TABLE 10-continued
| Structure | K | X | Ar | Bonded position | T |
|---|---|---|---|---|---|
| 70. | 1 | 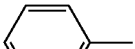 | 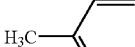 | 4 | —CH$_2$CH$_2$— |
| 71. | 1 |  | 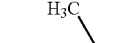 | 4 | —CH$_2$CH$_2$— |
| 72. | 1 |  |  | 4 | —CH$_2$CH$_2$— |
| 73. | 1 | | | 4 | —CH$_2$CH$_2$— |
TABLE 11
| Structure | K | X | Ar | Bonded position | T |
|---|---|---|---|---|---|
| 74. | 1 | | | 4 | —CH$_2$CH$_2$— |
| 75. | 1 | | | 4 | —CH$_2$CH$_2$— |

TABLE 11-continued
| Structure | K | X | Ar | Bonded position | T |
|---|---|---|---|---|---|
| 76. | 1 | 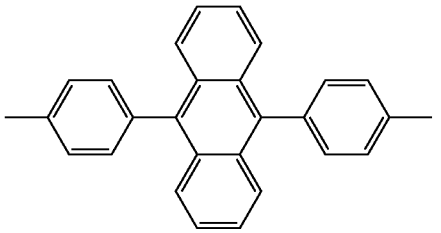 | 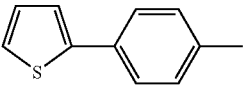 | 4 | —CH$_2$CH$_2$— |
| 77. | 1 | 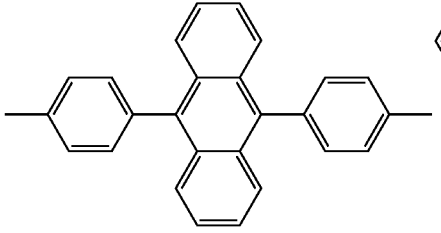 | 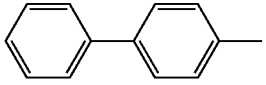 | 3 | —CH$_2$CH$_2$— |
| 78. | 1 | 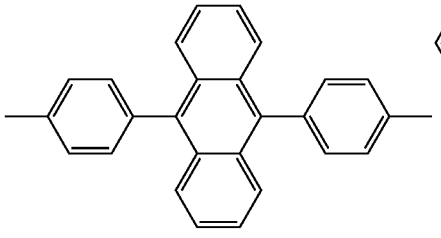 | 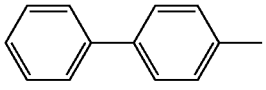 | 4 | —CH$_2$CH$_2$— |
| 79. | 1 | 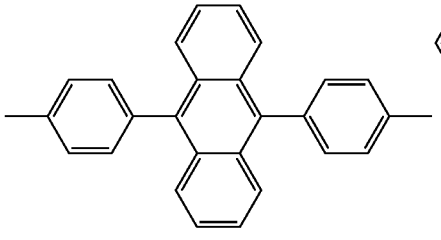 | 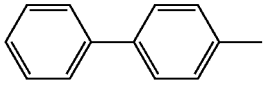 | 4 | 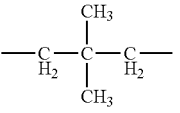 |
| 80. | 1 | 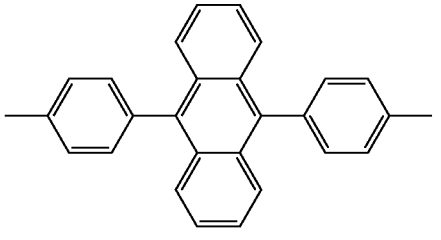 | 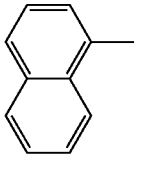 | 3 | —CH$_2$— |

TABLE 12
| Structure | K | X | Ar | Bonded position | T |
|---|---|---|---|---|---|
| 81. | 1 | 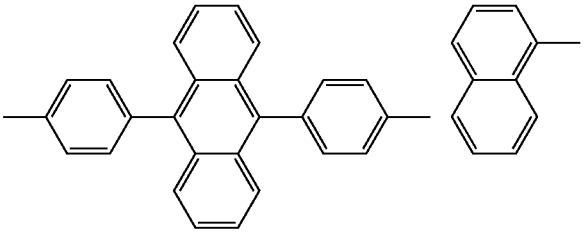 | 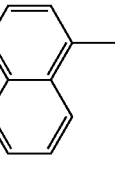 | 4 | —CH₂— |
| 82. | 1 | 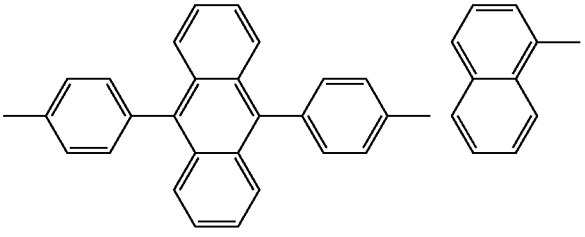 | 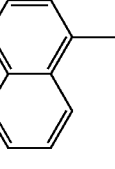 | 3 | —CH₂CH₂— |
| 83. | 1 | 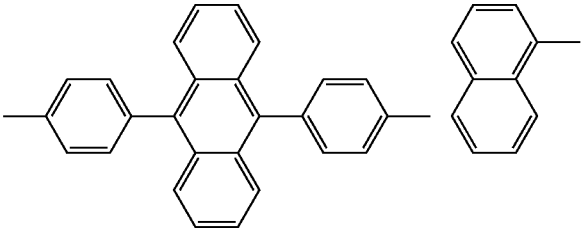 | 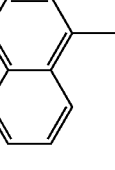 | 4 | —CH₂CH₂— |
| 84. | 1 | 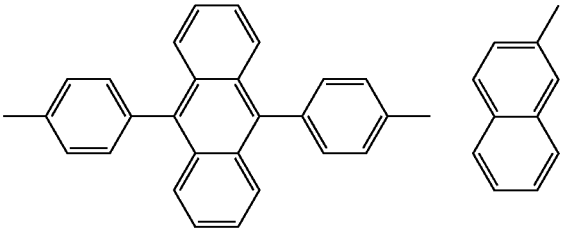 |  | 3 | —CH₂— |
| 85. | 1 | 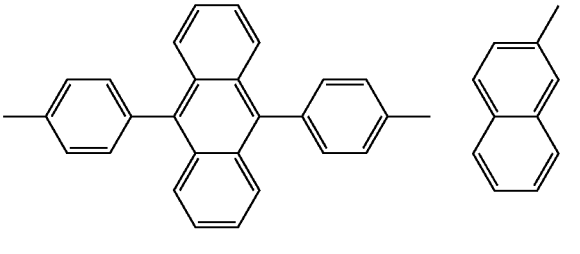 | 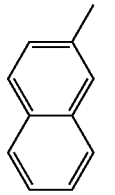 | 4 | —CH₂— |
| 86. | 1 | 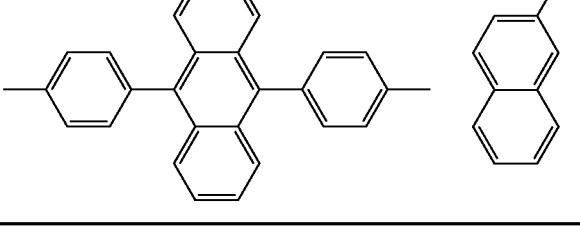 | 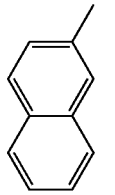 | 3 | —CH₂CH₂— |

TABLE 13
| Structure | K | X | Ar | Bonded position | T |
|---|---|---|---|---|---|
| 87. | 1 | 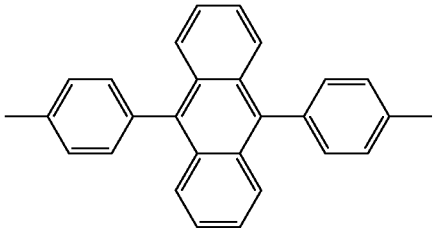 | 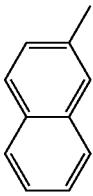 | 4 | —CH$_2$CH$_2$— |
| 88. | 1 | 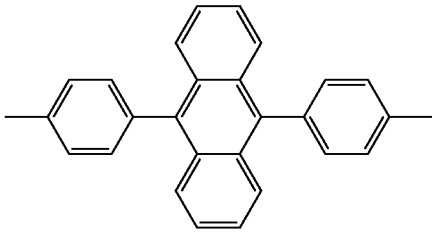 | 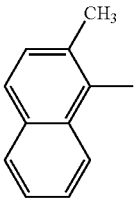 | 4 | —CH$_2$CH$_2$— |
| 89. | 1 | 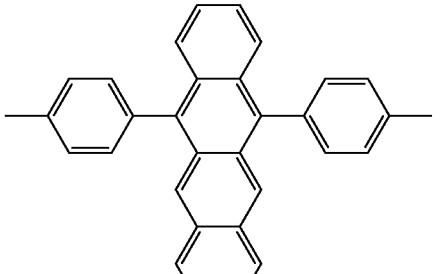 | 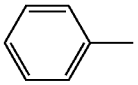 | 4 | —CH$_2$CH$_2$— |
| 90. | 1 | 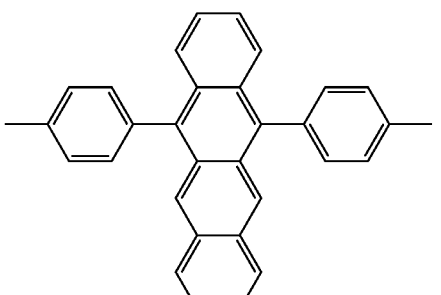 | 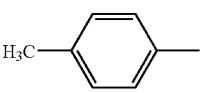 | 4 | —CH$_2$CH$_2$— |
| 91. | 1 | 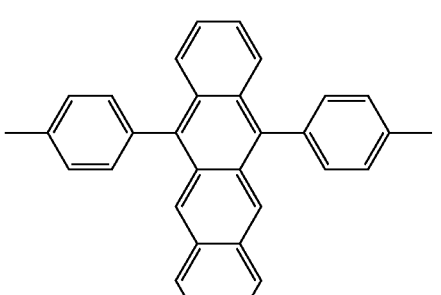 | 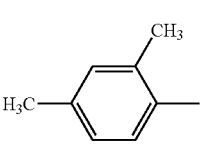 | 4 | —CH$_2$CH$_2$— |

TABLE 13-continued

| Structure | K | X | Ar | Bonded position | T |
|---|---|---|---|---|---|
| 92. | 1 | (5,12-diaryl-tetracene with two p-phenylene linkers) | 2,4-dimethylphenyl | 4 | —CH$_2$CH$_2$— |

TABLE 14

| Structure | K | X | Ar | Bonded position | T |
|---|---|---|---|---|---|
| 93. | 1 | (5,12-diaryl-tetracene with two p-phenylene linkers) | 4-methoxyphenyl | 4 | —CH$_2$CH$_2$— |
| 94. | 1 | p-phenylene–thiophene-2,5-diyl–p-phenylene | phenyl | 4 | —CH$_2$CH$_2$— |
| 95. | 1 | p-phenylene–thiophene-2,5-diyl–p-phenylene | 4-methylphenyl | 4 | —CH$_2$CH$_2$— |
| 96. | 1 | p-phenylene–thiophene-2,5-diyl–p-phenylene | 3,4-dimethylphenyl | 4 | —CH$_2$CH$_2$— |
| 97. | 1 | p-phenylene–thiophene-2,5-diyl–p-phenylene | 2,4-dimethylphenyl | 4 | —CH$_2$CH$_2$— |
| 98. | 1 | p-phenylene–thiophene-2,5-diyl–p-phenylene | thien-2-yl | 4 | —CH$_2$CH$_2$— |
| 99. | 1 | p-phenylene–thiophene-2,5-diyl–p-phenylene–thiophene-2,5-diyl–p-phenylene | | 4 | —CH$_2$CH$_2$— |

TABLE 14-continued
| Structure | K | X | Ar | Bonded position | T |
|---|---|---|---|---|---|
| 100. | 1 | 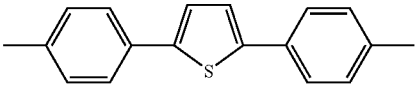 | 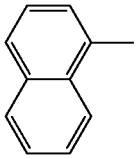 | 4 | —CH$_2$CH$_2$— |
| 101. | 1 | 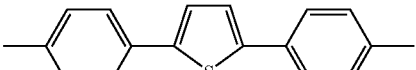 | 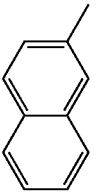 | 4 | —CH$_2$CH$_2$— |
TABLE 15
| Structure | K | X | Ar | Bonded position | T |
|---|---|---|---|---|---|
| 102. | 1 | 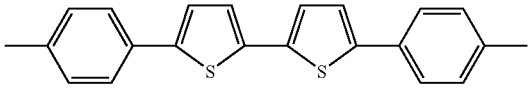 | 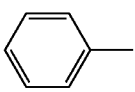 | 4 | —CH$_2$CH$_2$— |
| 103. | 1 | 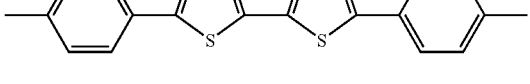 | 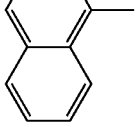 | 4 | —CH$_2$CH$_2$— |
| 104. | 1 | 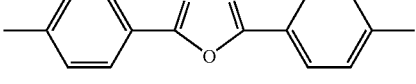 | 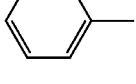 | 4 | —CH$_2$— |
| 105. | 1 | 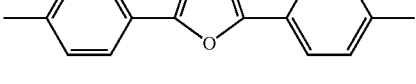 | 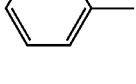 | 4 | —CH$_2$CH$_2$— |
| 106. | 1 | 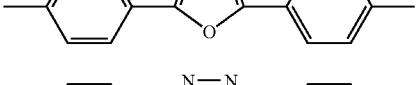 | 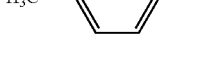 | 4 | —CH$_2$CH$_2$— |
| 107. | 1 | 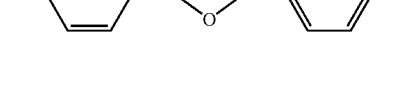 | 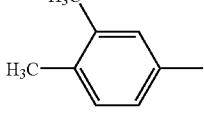 | 4 | —CH$_2$CH$_2$— |
| 108. | 1 | 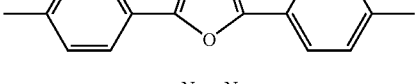 | 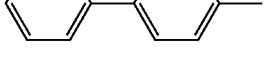 | 4 | —CH$_2$CH$_2$— |
| 109. | 1 | 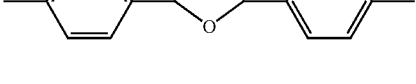 | 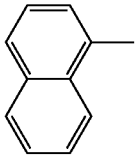 | 4 | —CH$_2$CH$_2$— |

TABLE 15-continued
| Structure | K | X | Ar | Bonded position | T |
|---|---|---|---|---|---|
| 110. | 1 | 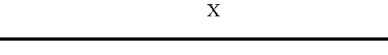 | 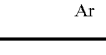 | 4 | —CH₂CH₂— |
TABLE 16
| Structure | K | X | Ar | Bonded position | T |
|---|---|---|---|---|---|
| 111. | 1 |  |  | 4 | —CH₂CH₂— |
| 112. | 1 |  | 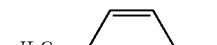 | 4 | —CH₂CH₂— |
| 113. | 1 | 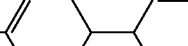 |  | 4 | —CH₂CH₂— |
| 114. | 1 |  | 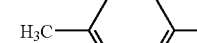 | 4 | —CH₂CH₂— |
| 115. | 1 |  |  | 4 | —CH₂CH₂— |

TABLE 17
| Structure | K | X | Ar | Bonded position | T |
|---|---|---|---|---|---|
| 116. | 1 | 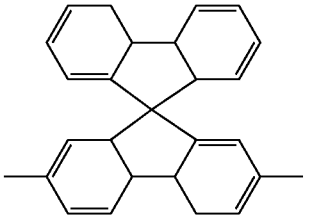 | 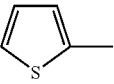 | 4 | —CH$_2$CH$_2$— |
| 117. | 1 | 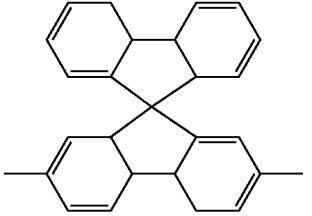 | 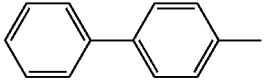 | 4 | —CH$_2$CH$_2$— |
TABLE 18
| Structure | K | X | Ar | Bonded position | T |
|---|---|---|---|---|---|
| 118. | 0 | 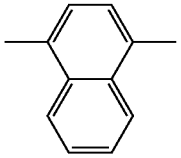 | 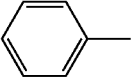 | 4,4' | —CH$_2$— |
| 119. | 0 | 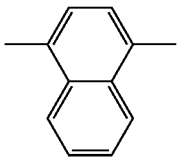 | 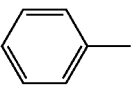 | 4,4' | —CH$_2$CH$_2$— |
| 120. | 0 | 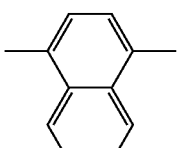 | 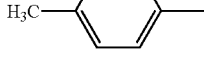 | 4,4' | —CH$_2$CH$_2$— |
| 121. | 0 | 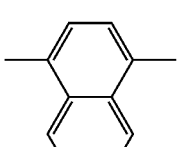 | 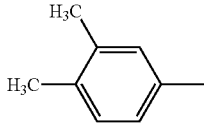 | 4,4' | —CH$_2$CH$_2$— |
| 122. | 0 | 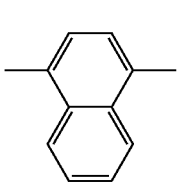 | 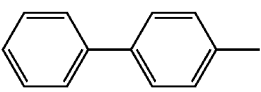 | 4,4' | —CH$_2$— |

TABLE 18-continued
| Structure | K | X | Ar | Bonded position | T |
|---|---|---|---|---|---|
| 123. | 0 | 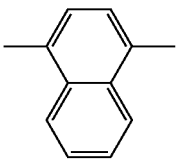 | 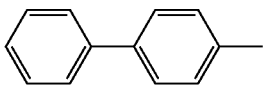 | 4,4' | —CH$_2$CH$_2$— |
| 124. | 0 | 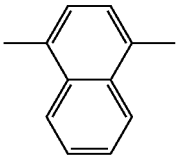 | 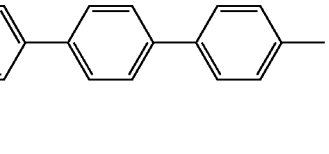 | 4,4' | $-\underset{H_2}{C}-\underset{\underset{CH_3}{CH_3}}{\overset{CH_3}{C}}-\underset{H_2}{C}-$ |
| 125. | 0 | 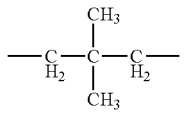 | 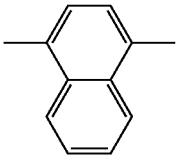 | 4,4' | —CH$_2$— |
| 126. | 0 | 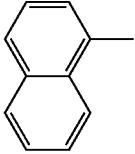 | 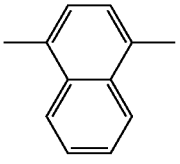 | 4,4' | —CH$_2$CH$_2$— |
TABLE 19
| Structure | K | X | Ar | Bonded position | T |
|---|---|---|---|---|---|
| 127. | 0 | 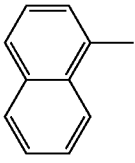 | 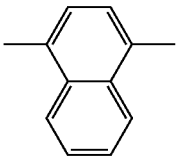 | 4,4' | —CH$_2$— |
| 128. | 0 |  | 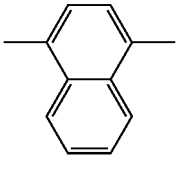 | 4,4' | —CH$_2$CH$_2$— |
| 129. | 0 | 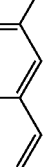 | 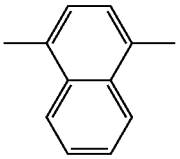 | 4,4' | —CH$_2$— |

TABLE 19-continued

| Structure | K | X | Ar | Bonded position | T |
|---|---|---|---|---|---|
| 130. | 0 | (naphthalene) | (anthracene) | 4,4' | —CH₂CH₂— |
| 131. | 1 | (anthracene) | (phenyl) | 4,4' | —CH₂— |
| 132. | 1 | (anthracene) | (phenyl) | 4,4' | —CH₂CH₂— |

TABLE 20

| Structure | K | X | Ar | Bonded position | T |
|---|---|---|---|---|---|
| 133. | 1 | (anthracene) | (phenyl) | 4,4' | —CH₂CH₂CH₂CH₂— |
| 134. | 1 | (anthracene) | (phenyl) | 4,4' | —CH₂—C(CH₃)₂—CH₂— |
| 135. | 1 | (anthracene) | (4-methylphenyl) | 4,4' | —CH₂CH₂— |

TABLE 20-continued
| Structure | K | X | Ar | Bonded position | T |
|---|---|---|---|---|---|
| 136. | 1 | 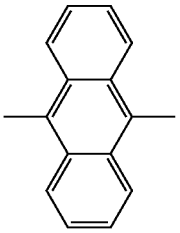 | 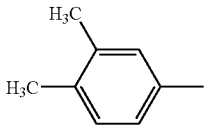 | 4,4' | —CH₂CH₂— |
| 137. | 1 | 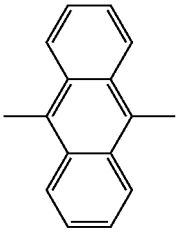 | 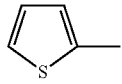 | 4,4' | —CH₂CH₂— |
| 138. | 1 | 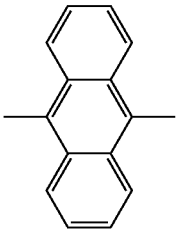 | 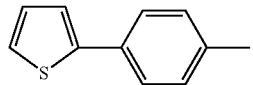 | 4,4' | —CH₂CH₂— |
| 139. | 1 | 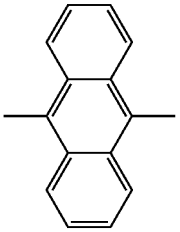 | 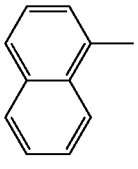 | 4,4' | —CH₂— |
TABLE 21
| Structure | K | X | Ar | Bonded position | T |
|---|---|---|---|---|---|
| 140. | 1 | 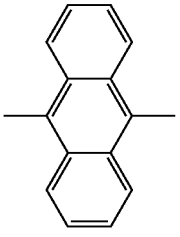 | | 4,4' | —CH₂CH₂— |

TABLE 21-continued
| Structure | K | X | Ar | Bonded position | T |
|---|---|---|---|---|---|
| 141. | 1 | 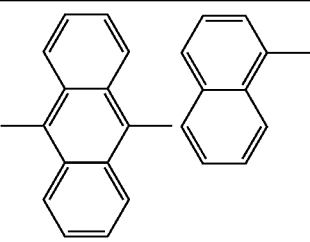 | 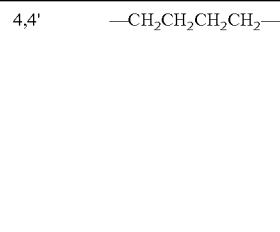 | 4,4' | —CH$_2$CH$_2$CH$_2$CH$_2$— |
| 142. | 1 | 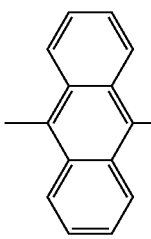 | 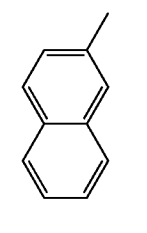 | 4,4' | —CH$_2$— |
| 143. | 1 | 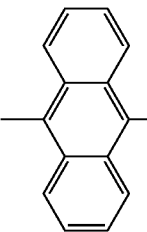 | 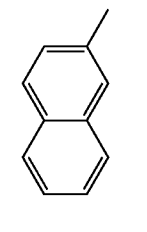 | 4,4' | —CH$_2$CH$_2$— |
| 144. | 1 | 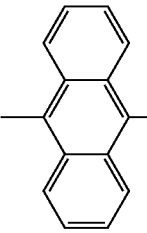 | 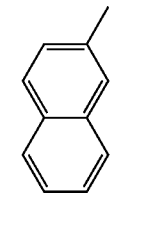 | 4,4' | —CH$_2$CH$_2$CH$_2$CH$_2$— |
| 145. | 1 | 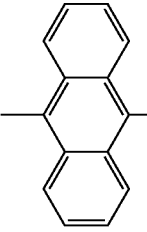 | 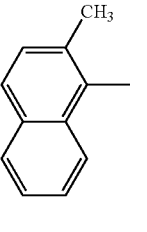 | 4,4' | —CH$_2$CH$_2$— |
TABLE 22
| Structure | K | X | Ar | Bonded position | T |
|---|---|---|---|---|---|
| 146. | 1 | 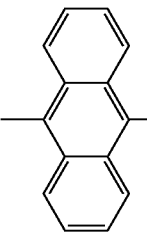 | 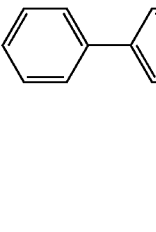 | 4,4' | —CH$_2$— |

TABLE 22-continued

| Structure | K | X | Ar | Bonded position | T |
|---|---|---|---|---|---|
| 147. | 1 | anthracene | biphenyl | 4,4' | —CH$_2$CH$_2$— |
| 148. | 1 | naphthalene | phenyl | 4,4' | —CH$_2$CH$_2$— |
| 149. | 1 | naphthalene | 4-methylphenyl | 4,4' | —CH$_2$CH$_2$— |
| 150. | 1 | naphthalene | 2,4-dimethylphenyl | 4,4' | —CH$_2$CH$_2$— |
| 151. | 1 | naphthalene | phenyl | 4,4' | —CH$_2$CH$_2$— |
| 152. | 1 | naphthalene | biphenyl | 4,4' | —CH$_2$CH$_2$— |
| 153. | 1 | naphthalene | naphthyl | 4,4' | —CH$_2$CH$_2$— |
| 154. | 1 | naphthalene | thienyl | 4,4' | —CH$_2$CH$_2$— |

TABLE 23
| Structure | K | X | Ar | Bonded position | T |
|---|---|---|---|---|---|
| 155. | 1 | 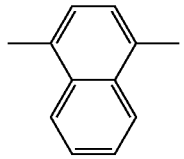 | 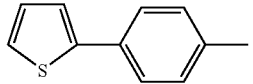 | 4,4' | —CH$_2$CH$_2$— |
| 156. | 1 | 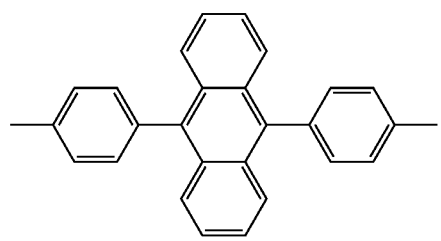 | 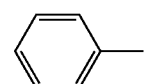 | 4,4' | —CH$_2$— |
| 157. | 1 | 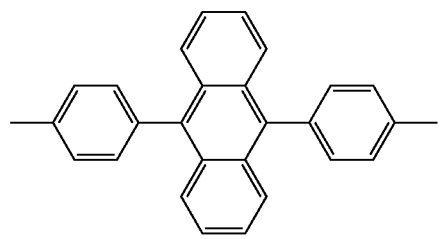 | 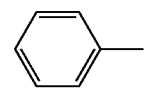 | 4,4' | —CH$_2$CH$_2$— |
| 158. | 1 | 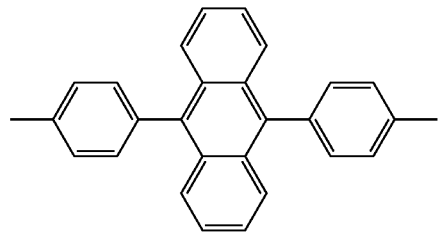 | 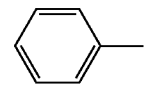 | 4,4' | 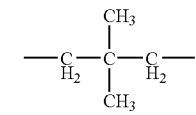 |
| 159. | 1 | 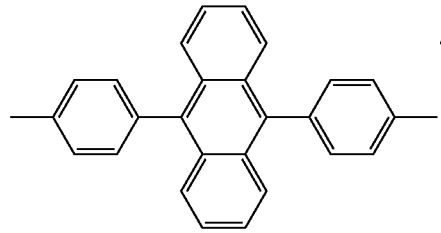 | 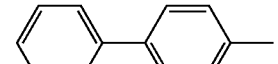 | 4,4' | —CH$_2$CH$_2$— |
| 160. | 1 | 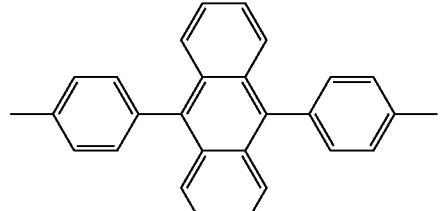 | 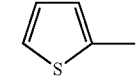 | 4,4' | —CH$_2$CH$_2$— |

TABLE 23-continued
| Structure | K | X | Ar | Bonded position | T |
|---|---|---|---|---|---|
| 161. | 1 | 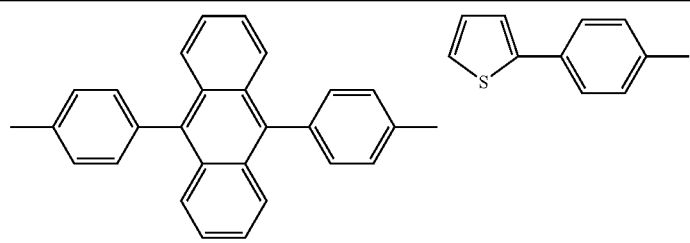 | 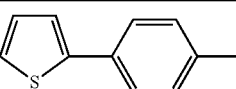 | 4,4' | —CH$_2$CH$_2$— |
TABLE 24
| Structure | K | X | Ar | Bonded position | T |
|---|---|---|---|---|---|
| 162. | 1 | 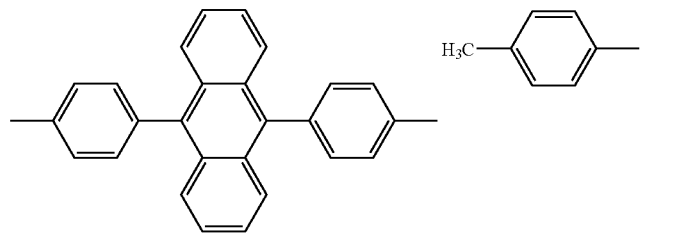 | 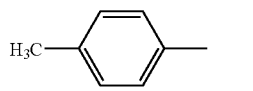 | 4,4' | —CH$_2$CH$_2$— |
| 163. | 1 | 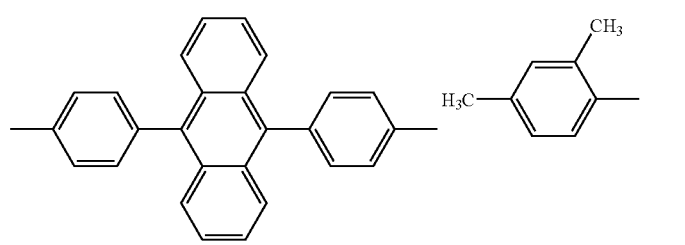 | 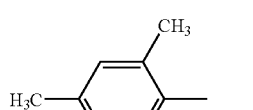 | 4,4' | —CH$_2$CH$_2$— |
| 164. | 1 | 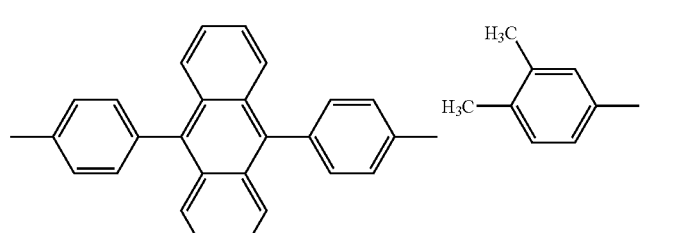 | 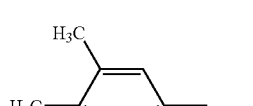 | 4,4' | —CH$_2$CH$_2$— |
| 165. | 1 | 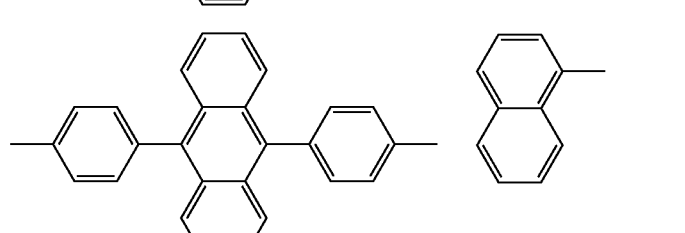 | 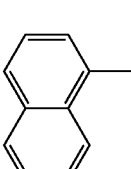 | 4,4' | —CH$_2$— |
| 166. | 1 | 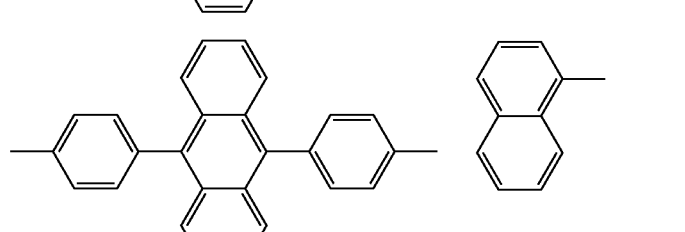 | 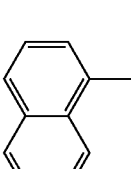 | 4,4' | —CH$_2$CH$_2$— |

TABLE 24-continued
| Structure | K | X | Ar | Bonded position | T |
|---|---|---|---|---|---|
| 167. | 1 | 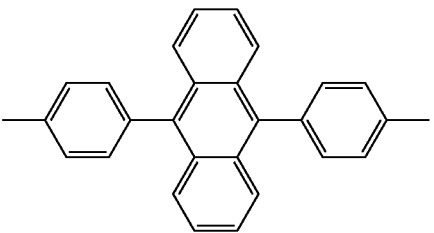 | 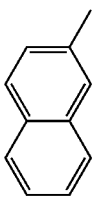 | 4,4' | —CH$_2$— |
| 168. | 1 | 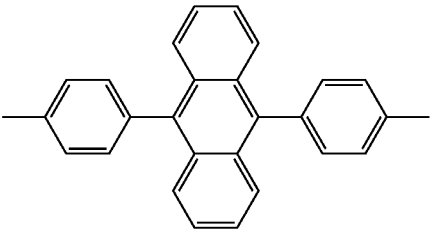 |  | 4,4' | —CH$_2$CH$_2$— |
TABLE 25
| Structure | K | X | Ar | Bonded position | T |
|---|---|---|---|---|---|
| 169. | 1 | 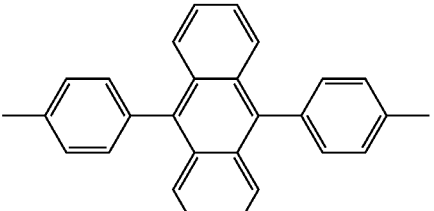 | 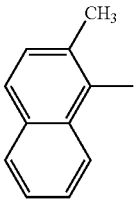 | 4,4' | —CH$_2$CH$_2$— |
| 170. | 1 | 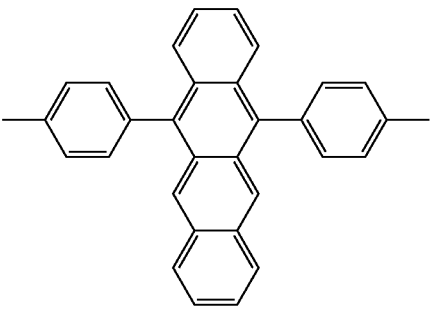 | 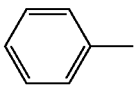 | 4,4' | —CH$_2$CH$_2$— |
| 171. | 1 | 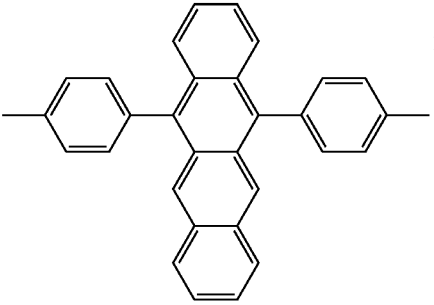 | 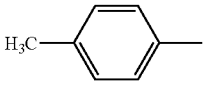 | 4,4' | —CH$_2$CH$_2$— |

TABLE 25-continued
| Structure | K | X | Ar | Bonded position | T |
|---|---|---|---|---|---|
| 172. | 1 | 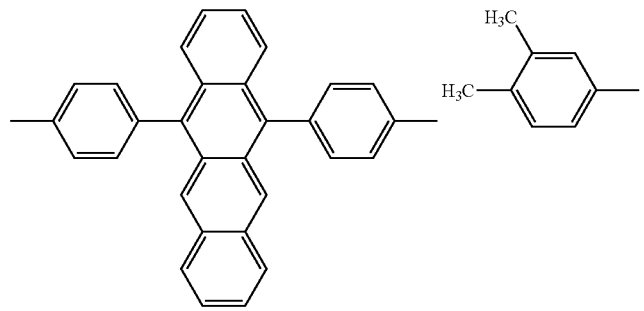 | 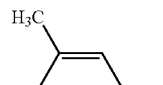 | 4,4' | —CH$_2$CH$_2$— |
| 173. | 1 | 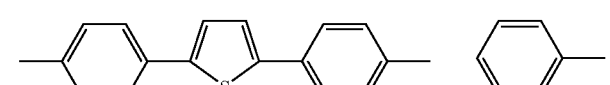 | 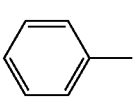 | 4,4' | —CH$_2$CH$_2$— |
| 174. | 1 | 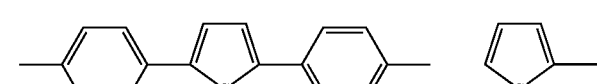 | 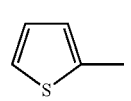 | 4,4' | —CH$_2$CH$_2$— |
| 175. | 1 | 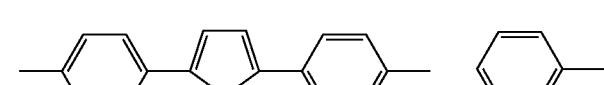 | 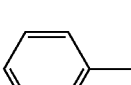 | 4,4' | —CH$_2$CH$_2$— |
TABLE 26
| Structure | K | X | Ar | Bonded position | T |
|---|---|---|---|---|---|
| 176. | 1 | 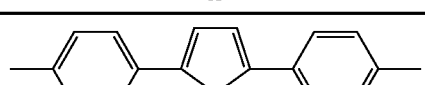 |  | 4,4' | —CH$_2$CH$_2$— |
| 177. | 1 | 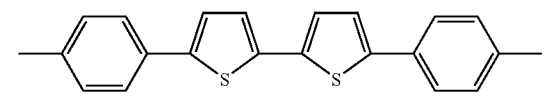 | 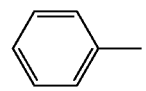 | 4,4' | —CH$_2$CH$_2$— |
| 178. | 1 | 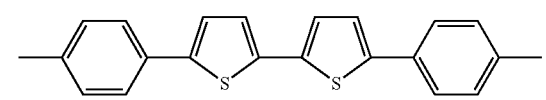 | 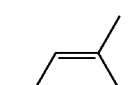 | 4,4' | —CH$_2$CH$_2$— |
| 179. | 1 | 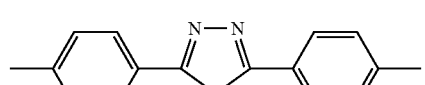 | 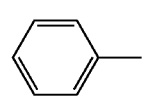 | 4,4' | —CH$_2$— |
| 180. | 1 | 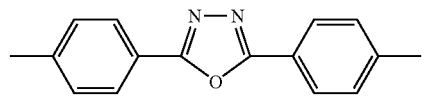 | 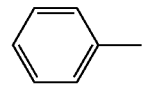 | 4,4' | —CH$_2$CH$_2$— |

TABLE 26-continued
| Structure | K | X | Ar | Bonded position | T |
|---|---|---|---|---|---|
| 181. | 1 | 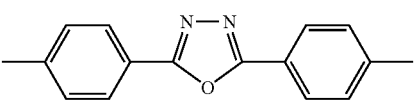 | 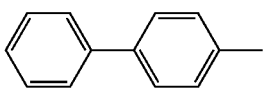 | 4,4' | —CH$_2$CH$_2$— |
| 182. | 1 | 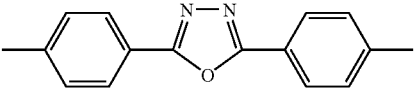 | 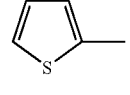 | 4,4' | —CH$_2$CH$_2$— |
| 183. | 1 | 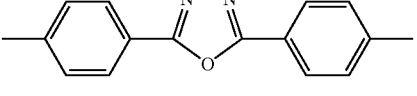 | 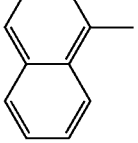 | 4,4' | —CH$_2$CH$_2$— |
| 184. | 1 | 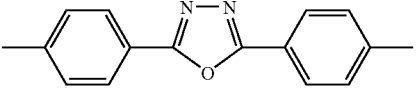 | 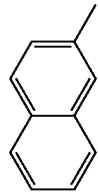 | 4,4' | —CH$_2$CH$_2$— |
TABLE 27
| Structure | K | X | Ar | Bonded position | T |
|---|---|---|---|---|---|
| 185. | 1 |  | 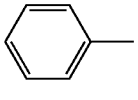 | 4,4' | —CH$_2$CH$_2$— |
| 186. | 1 | 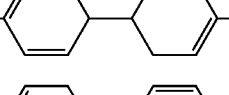 | 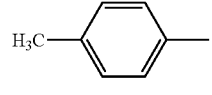 | 4,4' | —CH$_2$CH$_2$— |
| 187. | 1 | 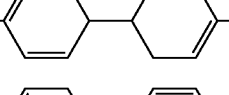 | 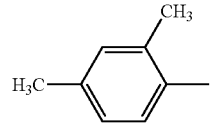 | 4,4' | —CH$_2$CH$_2$— |

TABLE 27-continued

| Structure | K | X | Ar | Bonded position | T |
|---|---|---|---|---|---|
| 188. | 1 | (spirobifluorene) | 2,4-dimethylphenyl | 4,4' | —CH₂CH₂— |
| 189. | 1 | (spirobifluorene) | 4-methoxyphenyl | 4,4' | —CH₂CH₂— |

TABLE 28

| Structure | K | X | Ar | Bonded position | T |
|---|---|---|---|---|---|
| 190. | 1 | (spirobifluorene) | biphenyl | 4,4' | —CH₂CH₂— |

As the charge-transferable polyether composed of a repetition unit containing at least one type selected from the structures represented by the general formulae (I-1) and (I-2) as its partial structure, those represented by the following general formula are preferably used.

R—O—[A—O]$_p$—R  (II)

In the general formula (II), A represents at least one type selected from the above formulae (I-1) and (I-2), and two or more types of structure A may be contained in one polymer.

In the general formula (II), R represents a hydrogen atom, an alkyl group, a substituted or unsubstituted aryl group or substituted or unsubstituted aralkyl group. As the alkyl group, those having 1 to 10 carbon atoms are preferable and a methyl group, ethyl group, propyl group and isopropyl group are exemplified. As the aryl group, those having 6 to 20 carbon atoms are preferable and a phenyl group and tolyl group are exemplified. As the aralkyl group, those having 7 to 20 carbon atoms are preferable and a benzyl group and phenethyl group are exemplified. Also, examples of the substituent of the substituted aryl group and substituted aralkyl group include a hydrogen atom, alkyl group, alkoxy group, substituted amino group and halogen atom. p denotes an integer from 3 to 5,000, and is preferably in a range from 5 to 100.

The weight average molecular weight Mw of the charge-transferable polyether used in the invention composed of a repeat unit containing at least one type selected from the structures represented by the general formulae (I-1) and (I-2) as its partial structure is preferably in a range from 5000 to 300000.

Specific examples of the above charge-transferable polyether represented by the general formula (II) are shown in Tables 29 and 30. However, the invention is not limited to these specific examples. In Tables 29 and 30, the numbers described in the column "Structure" correspond to the numbers of the structures which are the specific examples of the structures represented by the above formulae (I-1) and (I-2) shown in Tables 1 to 28. Also, m means the aforementioned m in the general formulae (I-1) and (I-2) and p means the aforementioned p in the general formula (II). Specific examples (compounds) to which each number is attached, for example, a specific example to which a number 15 is attached is called an exemplified compound (15).

TABLE 29

| Compound | Monomer | | | m | p |
|---|---|---|---|---|---|
| | Structure | Ratio | | | |
| (1) | 2 | — | | 1 | 53 |
| (2) | 4 | — | | 1 | 65 |
| (3) | 22 | — | | 1 | 98 |
| (4) | 24 | — | | 1 | 62 |
| (5) | 27 | — | | 2 | 31 |
| (6) | 29 | — | | 1 | 30 |
| (7) | 30 | — | | 1 | 45 |
| (8) | 32 | — | | 1 | 10 |

TABLE 29-continued

| Compound | Monomer Structure | Ratio | m | p |
|---|---|---|---|---|
| (9) | 36 | — | 1 | 22 |
| (10) | 38 | — | 1 | 105 |
| (11) | 44 | — | 0 | 14 |
| (12) | 44 | — | 1 | 30 |
| (13) | 44 | — | 2 | 35 |
| (14) | 45 | — | 1 | 86 |
| (15) | 47 | — | 2 | 10 |
| (16) | 48 | — | 1 | 65 |
| (17) | 53 | — | 1 | 103 |
| (18) | 70 | — | 1 | 74 |
| (19) | 73 | — | 1 | 32 |
| (20) | 74 | — | 1 | 33 |
| (21) | 75 | — | 1 | 18 |
| (22) | 83 | — | 1 | 49 |
| (23) | 89 | — | 1 | 16 |
| (24) | 92 | — | 1 | 30 |
| (25) | 94 | — | 1 | 36 |
| (26) | 97 | — | 1 | 12 |
| (27) | 102 | — | 1 | 66 |
| (28) | 104 | — | 1 | 87 |
| (29) | 107 | — | 1 | 77 |
| (30) | 111 | — | 1 | 38 |
| (31) | 114 | — | 1 | 61 |
| (32) | 116 | — | 1 | 14 |
| (33) | 132 | — | 1 | 87 |
| (34) | 136 | — | 1 | 22 |
| (35) | 138 | — | 1 | 14 |
| (36) | 140 | — | 1 | 91 |
| (37) | 148 | — | 1 | 32 |
| (38) | 150 | — | 1 | 47 |
| (39) | 157 | — | 1 | 23 |
| (40) | 159 | — | 1 | 22 |
| (41) | 160 | — | 1 | 38 |

TABLE 30

| Compound | Monomer Structure | Ratio | m | p |
|---|---|---|---|---|
| (42) | 164 | — | 1 | 35 |
| (43) | 170 | — | 1 | 18 |
| (44) | 173 | — | 1 | 28 |
| (45) | 177 | — | 1 | 54 |
| (46) | 185 | — | 2 | 12 |
| (47) | 186 | — | 1 | 66 |
| (48) | 188 | — | 1 | 26 |
| (49) | 22/44 | 1/1 | 1 | 25 |
| (50) | 22/46 | 1/1 | 1 | 22 |
| (51) | 22/54 | 1/2 | 1 | 36 |
| (52) | 22/70 | 1/1 | 2 | 75 |
| (53) | 22/94 | 1/1 | 1 | 38 |
| (54) | 22/102 | 1/1 | 1 | 45 |
| (55) | 27/44 | 1/1 | 1 | 16 |
| (56) | 27/46 | 1/1 | 1 | 68 |
| (57) | 22/101 | 1/1 | 1 | 28 |
| (58) | 32/73 | 1/1 | 1 | 67 |
| (59) | 22/32/132 | 1/1/1 | 1 | 22 |
| (60) | 32/157 | 1/1 | 1 | 28 |

In the invention, the charge-transferable polyether composed of a repeat unit containing at least one type selected from the structures represented by the general formulae (I-1) and (I-2) as its partial structure may be easily synthesized by condensing a charge-transferable compound having a hydroxyl group bonded with T represented by the following general formula (III-1) or (III-2) among molecules. Here, Ar, X, T, m and k in the following general formulae (III-1) and (III-2) have the same meanings as those in the above formulae (I-1) and (I-2).

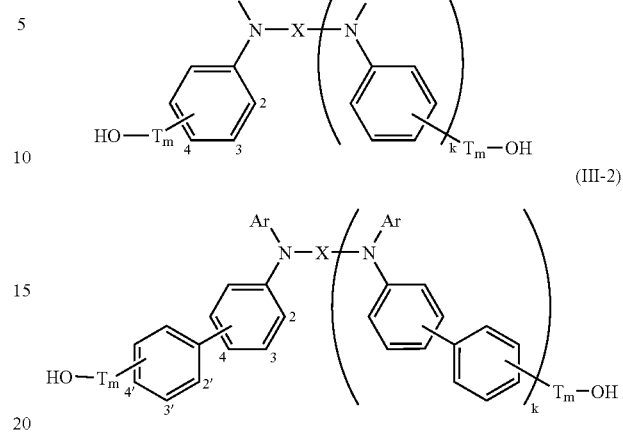

Although no particular limitation is imposed on a method of synthesizing the aforementioned charge-transferable polyether, the following first to third methods, for example, may be utilized.

In the first synthetic method, a charge-transferable compound (hereinafter abbreviated as "charge-transferable monomer (III)") having two hydroxyl groups and represented by the general formula (III-1) and/or the general formula (III-2) is dehydration-condensed under heating to synthesize the charge-transferable polyether. In the present invention it is to be noted that in the case of simply describing "charge-transferable monomer", it means all polymerizable charge-transferable materials except for the "charge-transferable monomer (III)", unless otherwise noted.

In this case, it is desirable to melt the charge-transferable monomer (III) under heat in no solvent and to react it under reduced pressure to promote a polymerization reaction by the dissociation of water. Also, when using a solvent, a solvent which forms an azeotrope with water, for example, trichloroethane, toluene, chlorobenzene, dichlorobenzene, nitrobenzene and 1-chloronaphthalene are effective to remove water and is used in an amount ranging from 1 to 100 equivalents, preferably 2 to 50 equivalents, to one equivalent of the charge-transferable monomer (III). Although the reaction temperature may be arbitrarily set, it is preferable to react the monomer at the boiling temperature of the solvent to remove the water produced in the polymerization. In the case where the polymerization does not proceed, the solvent may be removed from the reaction system and the reaction system in a thickened state may be stirred under heating.

In the second synthetic method, a charge-transferable monomer is dehydration-condensed using, as an acid catalyst, a protonic acid such as p-toluenesulfonic acid, hydrochloric acid, sulfuric acid or trifluoroacetic acid or a Lewis acid such as zinc chloride to synthesize the charge-transferable polyether.

In this case, the acid catalyst is used in an amount ranging from $1/10000$ to $1/10$ equivalents, preferably $1/1000$ to $1/50$ equivalents, to one equivalent of the charge-transferable monomer (III). It is desirable to use a solvent which forms an azeotrope with water to remove the water produced in the polymerization. As the solvent, for example, toluene, chlorobenzene, dichlorobenzene, nitrobenzene and 1-chloronaphthalene are effective and is used in an amount ranging from 1 to 100 equivalents and preferably 2 to 50 equivalents to one equivalent of the charge-transferable monomer (III). Although the reaction temperature may be arbitrarily set, it is preferable to react the monomer at the boiling temperature of the solvent to remove the water produced in the polymerization.

In the third synthetic method, the charge-transferable monomer (III) is dehydration-condensed using a condensing agent such as an alkylisocyanate, e.g., cyclohexylisocyanate, alkylcyanate, e.g., cyclohexylcyanate, cyanate, e.g., p-tolyl-cyanate or 2, 2-bis(4-cyanatophenyl)propane, dichlorohexylcarbodiimide (DCC) or trichloroacetonitrile to synthesize the charge-transferable polyether.

In this case, the condensing agent is used in an amount ranging from ½ to 10 equivalents, preferably 1 to 3 equivalents, to one equivalent of the charge-transferable monomer (III). As the solvent, for example, toluene, chlorobenzene, dichlorobenzene and 1-chloronaphthalene are effective and the solvent is used in an amount ranging from 1 to 100 equivalents, preferably 2 to 50 equivalents, to one equivalent of the charge-transferable monomer (III). Although the reaction temperature may be arbitrarily set, it is preferable to react the monomer at temperatures ranging from ambient temperature to the boiling temperature of the solvent.

Among the first to third synthetic methods, the first and third synthetic methods are preferable since isomerization and side reactions are hardly caused. Particularly the third synthetic method is more preferable since the reaction condition in this method is milder.

After the reaction is completed, the reaction product is dissolved in a soluble solvent when no solvent was originally used for the reaction. When a solvent was used, the reaction product is added dropwise, as it is, to a poor solvent, such as alcohols such as methanol and ethanol or acetone, in which the charge-transferable polyether is sparingly soluble, to precipitate and to separate a charge-transferable polyether, which is then thoroughly washed with water or an organic solvent, followed by drying. Moreover, as required, reprecipitation treatment in which the resulting charge-transferable polyether is dissolved in a proper solvent, then added dropwise to a poor solvent to precipitate the charge-transferable polyether may be repeated. In this reprecipitation treatment, it is desirable to carry out efficient stirring using a device such as a mechanical stirrer. The solvent used to dissolve the charge-transferable polyether in the reprecipitation treatment is used in an amount range from 1 to 100 equivalents, preferably 2 to 50 equivalents, to one equivalent of the charge-transferable polyether. Also, the poor solvent is used in an amount range from 1 to 1000 equivalents, preferably 10 to 500 equivalents, to one equivalent of the charge-transferable polyether. Moreover, in the above reaction, it is possible to synthesize a copolymer by using one or more, preferably two to five, and more preferably two or three, charge-transferable monomers in combination with the charge-transferable monomer (III). The electric characteristics, filming characteristics, solubility and fluorescent characteristics of the obtained copolymer can be controlled by copolymerizing the charge-transferable monomer (III) with the charge-transferable monomers.

When the degree of polymerization of the charge-transferable polyether is too low, a firm film can hardly be obtained whereas when it is too high, the solubility of the charge-transferable polyether in a solvent declines and the processability is impaired. The degree of polymerization is therefore designed to be in a range from 5 to 5000, preferably 10 to 3000, and more preferably 15 to 1000.

The terminal group R of the charge-transferable polyether represented by the general formula (II) may be a hydroxyl group like the case of the charge-transferable monomer (III). The above terminal group R may also be modified to control material qualities such as solubility, filming characteristics and mobility. For example, a terminal hydroxyl group can be alkyl-etherealized using an alkyl sulfate, alkyl iodide or the like. A specific reagent used for this etherealization may be arbitrarily selected from dimethyl sulfate, diethyl sulfate, methyl iodide, ethyl iodide and the like and is used in an amount ranging from 1 to 3 equivalents, preferably 1 to 2 equivalents, to the terminal hydroxyl group. At this time, a base catalyst may be used. The base catalyst may be selected from sodium hydroxide, potassium hydroxide, sodium hydride, metal sodium and the like and is used in an amount range preferably 3 equivalents or less, and more preferably from 1 to 2 equivalents to the terminal hydroxyl group. The reaction may be run at a temperature from 0° C. to the boiling point of the solvent to be used. Also, as the solvent used at this time, a single solvent or a mixed solvent consisting of two or three solvents may be used. The solvents may be selected from inert solvents such as benzene, toluene, methylene chloride, tetrahydrofuran, N, N-dimethylformamide, dimethylsulfoxide, N-methylpyrrolidone and 1, 3-dimethyl-2-imidazolidinone. Also, a quaternary ammonium salt such as tetra-n-butylammonium iodide may be used as a phase transfer catalyst depending on the reaction. The terminal group R may be changed to an acyl group by the acylation of the terminal hydroxyl group by using an acid halide. Although no particular limitation is imposed on the acid halide, examples of the acid halide include acryloyl chloride, crotonoyl chloride, methacryloyl chloride, n-butyl chloride, 2-furoyl chloride, benzoyl chloride, cyclohexanecarbonyl chloride, enanthyl chloride, phenylacetyl chloride, o-toluoyl chloride, m-toluoyl chloride and p-toluoyl chloride. The acid halide is used in an amount ranging from 1 to 3 equivalents, preferably 1 to 2 equivalents, to the terminal hydroxyl group. At this time, a base catalyst may be used. The base catalyst may be arbitrarily selected from pyridine, dimethylaminopyridine, trimethylamine, triethylamine and the like and is used in an amount ranging from 1 to 3 equivalents, preferably 1 to 2 equivalents, to the acid chloride. Examples of the solvent to be used at this time include benzene, toluene, methylene chloride, tetrahydrofuran and methyl ethyl ketone. The reaction may be run at temperatures ranging from 0° C. to the boiling point of the solvent and preferably run at temperature ranging from 0° C. to 30° C. Further, the terminal group can be acylated also using an acid anhydride such as acetic acid anhydride. When using a solvent, an inert solvent, specifically, benzene, toluene or chlorobenzene may be used. The reaction may be run at temperatures ranging from 0° C. to the boiling point of the solvent and preferably 40° C. to the boiling point.

Other than the above, a urethane residue (-CONH-R') may be introduced into the terminal by using a monoisocyanate. A specific one as the monoisocyanate may be arbitrarily selected from benzylisocyanate, n-butylisocyanate, t-butylisocyanate, cyclohexylisocyanate, 2, 6-dimethylisocyanate, ethylisocyanate, isopropylisocyanate, 2-methoxyphenylisocyanate, 4-methoxyphenylisocyanate, n-octadecylisocyanate, phenylisocyanate, I-propylisocyanate, m-tolylisocyanate, p-tolylisocyanate and 1-naphthylisocyanate. The monoisocyanate is used in an amount ranging from 1 to 3 equivalents, preferably 1 to 2 equivalents, to the terminal hydroxyl group. Examples of the solvent to be used at this time may include benzene, toluene, chlorobenzene, dichlorobenzene, methylene chloride, tetrahydrofuran, N, N-dimethylformamide, dimethylsulfoxide, N-methylpyrrolidone and 1, 3-dimethyl-2-imidazolidinone. The reaction may be run at temperatures ranging from 0° C. to the boiling point of the solvent to be used. In cases where the reaction proceeds with difficulty, a metal compound such as dibutyltin (II) dilaurate, tin (II) octylate or lead naphthenate or a tertiary amine such as triethylamine, trimethylamine, pyridine or dimethylaminopyridine may be added as a catalyst.

Next, the layer structure of the organic electroluminescent element of the invention will be explained in detail.

The electroluminescent element of the invention comprises a pair of electrodes consisting of an anode and a cathode, at least one of which is transparent or semitransparent, and one or plural organic compound layers sandwiched between the pair of electrodes, wherein at least one of the organic compound layers contains the aforementioned charge-transferable polyether.

In the organic electroluminescent element of the invention, the organic compound layer is a light emitting layer having charge-transferability when the organic compound layer has a monolayer structure and the light emitting layer having the charge-transferability contains the aforementioned charge-transferable polyether.

When the organic compound layer has a multilayer structure, on the other hand, (namely, in the case of a function-separating type in which each layer has a different function), at least one layer is a light emitting layer or a light emitting layer having charge-transferability. In this case, examples of the layer structure consisting of a light emitting layer or the light emitting layer having charge-transferability and other layers include a layer structure (1) constituted of the light emitting layer and an electron transfer layer, a layer structure (2) constituted of a hole transfer layer, the light emitting layer and an electron transfer layer, and a layer structure (3) constituted of a hole transfer layer and the light emitting layer having charge-transferability. Layers other than the light emitting layer and the light emitting layer having charge-transferability in these layer structures (1) to (3) have a function as a charge transfer layer.

In the layer structure (1), the charge-transferable polyether is contained in at least one of the light emitting layer and the electron transfer layer. In the layer structure (2), the charge-transferable polyether is contained in at least one of the hole transfer layer and the electron transfer layer. In the layer structure (3), the charge-transferable polyether is contained in at least one of the hole transfer layer and the light emitting layer having charge-transferability.

Also, the light emitting layer having charge-transferability may further contain a charge-transferable compound (hole transfer materials and electron transfer materials) other than the aforementioned charge-transferable polyether. The details will be described later.

The organic electroluminescent element of the invention will be explained in detail with reference to the drawings. The following explanations are not intended to be limiting of the invention and organic electroluminescent elements having any structure are within the scope of the invention as far as these elements contain the aforementioned charge-transferable polyether in one or plural organic compound layers constituting the organic electroluminescent element of the invention.

Figure 2:
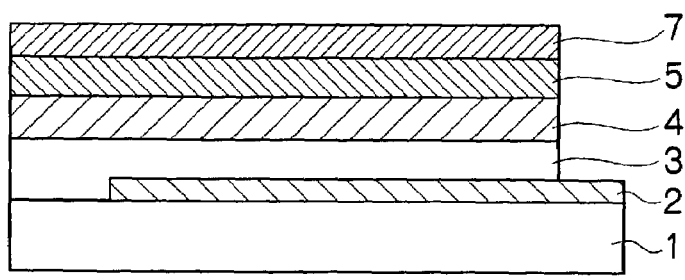
FIG. 2 is a schematic structural view showing another example of the layer structure of an organic electroluminescent element according to the invention.
Figure 3:
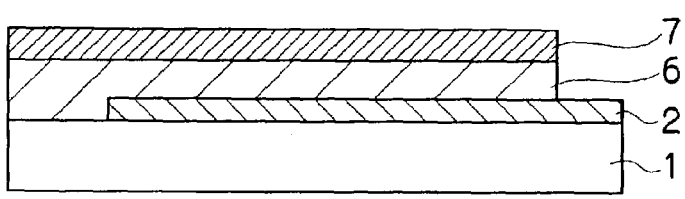
FIG. 3 is a schematic structural view showing another example of the layer structure of an organic electroluminescent element according to the invention.
Figure 4:
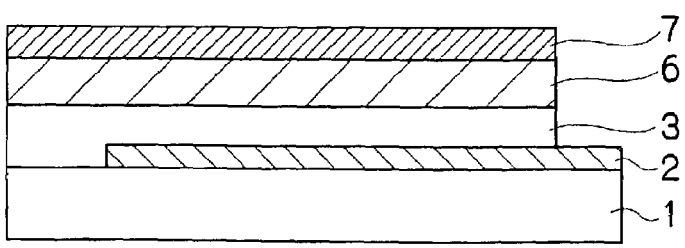
FIG. 4 is a schematic structural view showing yet another example of the layer structure of an organic electroluminescent element according to the invention.

FIGS. 1 to 4 are typical sectional views for explaining the layer structure of the organic electroluminescent element of the invention. FIGS. 1, 2 and 4 are examples showing the cases where the organic compound layer is constituted of plural layers. These figures correspond to the already explained layer structures (1), (2) and (3) respectively. On the other hand, FIG. 3 is an example showing the case where the organic compound layer is constituted of only one layer. In FIGS. 1 to 4, the same symbols are attached to parts having the same functions to explain these parts.

The organic electroluminescent element shown in FIG. 1 comprises a transparent insulator substrate 1, and a transparent electrode 2, a light emitting layer 4, an electron transfer layer 5 and a backface electrode 7 which are laminated in this order on the transparent insulator substrate 1. The organic electroluminescent element shown in FIG. 2 comprises a transparent insulator substrate 1, and a transparent electrode 2, a hole transfer layer 3, a light emitting layer 4, an electron transfer layer 5 and a backface electrode 7 which are laminated in this order on the transparent insulator substrate 1. The organic electroluminescent element shown in FIG. 3 comprises a transparent insulator substrate 1, and a transparent electrode 2, a light emitting layer 6 having charge-transferability and a backface electrode 7 which are laminated in this order on the transparent insulator substrate 1. The organic electroluminescent element shown in FIG. 4 comprises a transparent insulator substrate 1, and a transparent electrode 2, a hole transfer layer 3, a light emitting layer 6 having charge-transferability and a backface electrode 7 which are laminated in this order on the transparent insulator substrate 1. Each organic electroluminescent element will be hereinafter explained in detail.

It is to be noted that the organic electroluminescent elements shown in FIGS. 1 and 2 have layer structures provided with the electron transfer layer 5 between the light emitting layer 4 and the backface electrode 7 in order to improve either the heat resistance or the luminous efficacy of the organic electroluminescent element. When the light emitting layer 4 is formed by vacuum deposition of light emitting materials or application and drying of a dispersion or a solution containing light emitting materials, and the light emitting layer 4 does not become a thin film having superior heat resistance and filming characteristics, the electron transfer layer 5 is provided. The electron transfer layer 5 is provided also when the light emitting layer 4 does not exhibit clear electron-transferability. The organic compound layer containing the aforementioned charge-transferable polyether in the invention can act, depending on its structure, as any of the hole transfer layer 3 and the electron transfer layer 5 in the case of the layer structure of the organic electroluminescent element shown in FIGS. 1 and 2, and also as any of the hole transfer layer 3 and the light emitting layer 6 having carrier-transferability in the case of the layer structure of the organic electroluminescent elements shown in FIGS. 3 and 4.

In the organic electroluminescent elements shown in FIGS. 1 to 4, the transparent insulator substrate 1 is preferably a transparent material such as glass and a plastic film to take out emitted light. It is to be noted that the aforementioned term "transparent" means that the transmittance for visible light is 10% or more and this transmittance is preferably 75% or more.

The transparent electrode 2 is also preferably made of a material which is transparent to take out emitted light like the transparent insulator substrate 1 and has a large work function to inject holes. The work function is preferably 4 eV or more. Examples of such a material to be used include oxide films such as indium tin oxide (ITO), tin oxide (NESA), indium oxide, zinc oxide and zinc indium oxide and films of metals, such as gold, platinum and palladium, which are formed by vapor deposition or sputtering. It is more preferable that the sheet resistance of the transparent electrode 2 be lower, preferably several hundred Ω/□ or less and specifically 100 Ω/□ or less. Also, like the transparent insulator substrate 1, the transparent electrode 2 is a transmittance of preferably 10% or more and more preferably 75% or more for light in the visible region.

In the organic electroluminescent element shown in FIGS. 2 and 4, the hole transfer layer 3 may be formed only of the aforementioned charge-transferable polyether provided with a function (hole-transferability) corresponding to the object, or may also be formed by further mixing and dispersing a hole transfer material other than the charge-transferable polyether in an amount ranging from 0.1% by weight to 50% by weight to control hole mobility. Examples of such a hole transfer material include tetraphenylenediamine derivatives, triphenylamine derivatives, carbazole derivatives, stilbene derivatives, arylhydrazone derivatives and porphyrin type compounds. Tetraphenylenediamine derivatives and triphenylamine derivatives are preferable due to their good compatibility with the charge-transferable polyether. It is to be noted that the hole transfer layer 3 may be formed only of a hole transfer material without containing the charge-transferable polyether at all.

Proper resins (polymers) and additives may be added to the hole transfer layer 3 for the purpose of improving filming characteristics and of preventing pinholes. As specific materials of the resin, conductive resins such as a polycarbonate resin, polyester resin, methacryl resin, acryl resin, polyvinyl chloride resin, cellulose resin, urethane resin, epoxy resin, polystyrene resin, polyvinyl acetate resin, styrene butadiene copolymer, vinylidene chloride/acrylonitrile copolymer, vinyl chloride/vinyl acetate/maleic acid anhydride copolymer, silicon resin, poly-N-vinylcarbazole resin, polysilane resin, polythiophene and polypyrrole may be used. Also, as the additives, known antioxidants, ultraviolet absorbing agents and plasticizers may be used.

In the organic electroluminescent element shown in FIGS. 1 and 2, a compound exhibiting a high fluorescent quantum yield in a solid state is used as a light emitting material in the light emitting layer 4. In the case where the light emitting material is an organic low molecule, it is preferable that a good thin film can be formed by a vacuum deposition method or by applying/drying a solution or a dispersion solution containing the organic low molecule and a resin. As the resin contained in the above solution or dispersion solution, those exemplified in the case of the aforementioned hole transfer layer 3 may be applied. Also, in the case where the aforementioned light emitting material is made of a polymer, it is preferable that a good thin film can be formed by applying/drying a solution or a dispersion solution containing the polymer.

As preferable examples of the organic low molecule when the aforementioned light emitting material is the organic low molecule, a chelate type organic metal complex, polynuclear or condensed aromatic hydrocarbon compound, perillene derivative, cumarin derivative, styrylallylene derivative, silol derivative, oxazole derivative, oxathiazole derivative and oxadiazole derivative or the like is used. As preferable examples of the polymer when the aforementioned light emitting material is a polymer, a polyparaphenylene derivative, polyparaphenylenevinylene derivative, polythiophene derivative, polyacetylene derivative or the like is used.

As specific examples of these organic low molecules and polymers, compounds (IV-1) to compounds (IV-15) shown below are used though not limited to these compounds. In the compounds (IV-13) to (IV-15), n and x denote an integer of 1 or more.

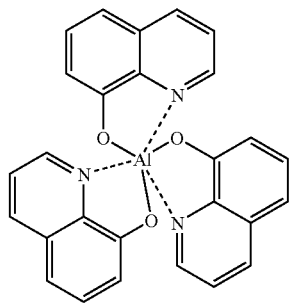
(IV-1)

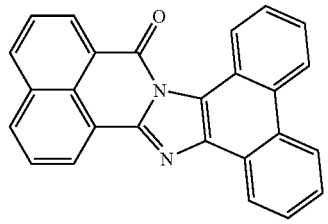
(IV-2)

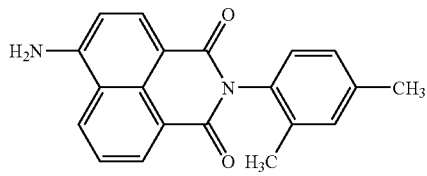
(IV-3)

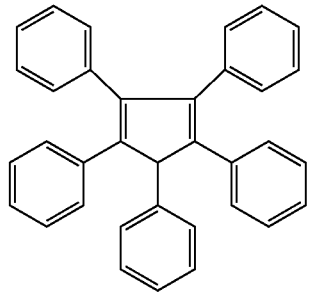
(IV-4)

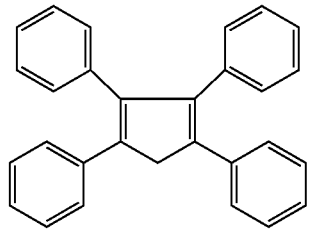
(IV-5)

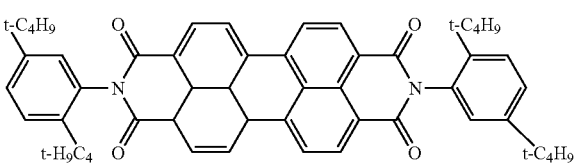
(IV-6)

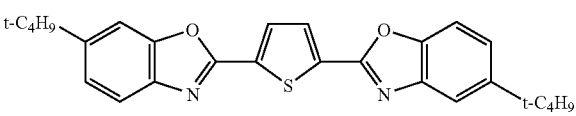
(IV-7)

-continued (IV-8)
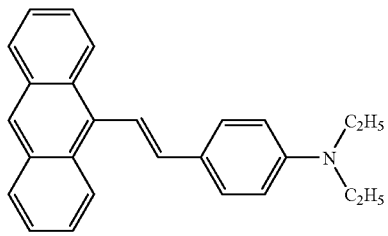

(IV-9)
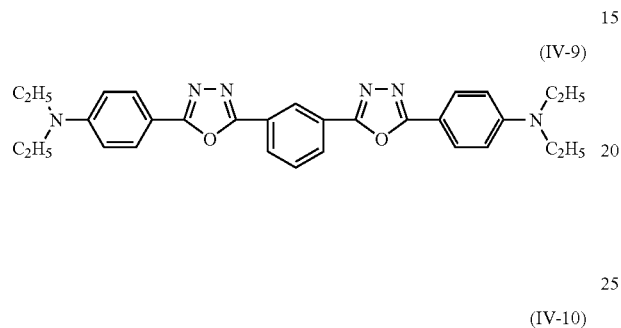

(IV-10)
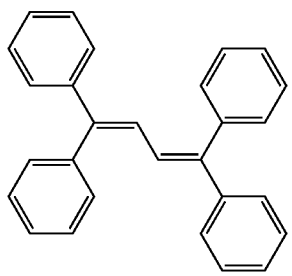

(IV-11)
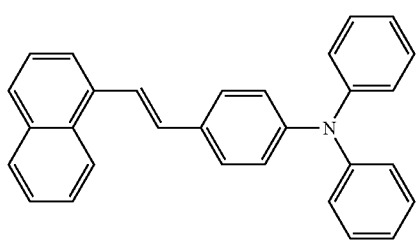

(IV-12)
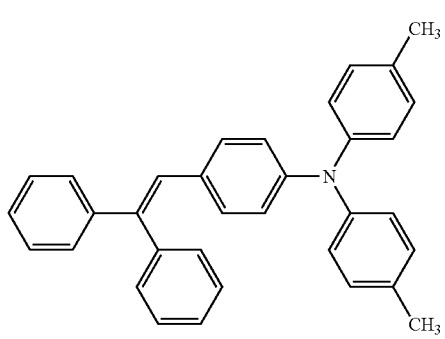

-continued (IV-13)
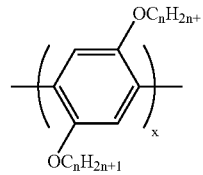

(IV-14)
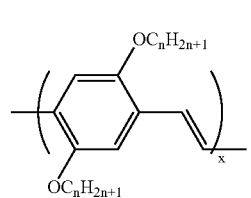

(IV-15)
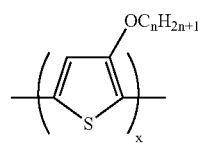

Also, the aforementioned light emitting material may be doped with a dye compound different from the light emitting material as a guest material for improving the durability and luminous efficacy of the organic electroluminescent element. When the light emitting layer 4 is formed by vacuum deposition, the above light emitting material and the above dye material may be co-deposited to carry out doping. In the case of forming the light emitting layer 4 by applying/drying a solution or a dispersion solution, the dye compound may be compounded in a solution or a dispersion solution to carry out doping. The proportion of the dye compound in the doping of the light emitting layer 4 is preferably in a range from 0.001% by weight to 40% by weight and more preferably 0.001% by weight to 10% by weight. As such a dye compound to be used for doping, an organic compound is used which is highly compatible with the light emitting material and does not disturb the formation of a good thin film of the light emitting layer 4. Preferably used organic compounds are a DCM derivative, quinacridone derivative, rubrene derivative, porphyrin or the like. Preferable and specific examples of dye compound include, though not limited to, the following compounds (V-1) to (V-4).

(V-1)
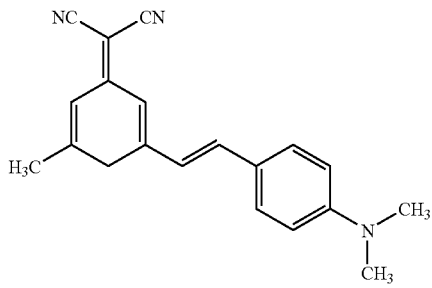

(V-2)
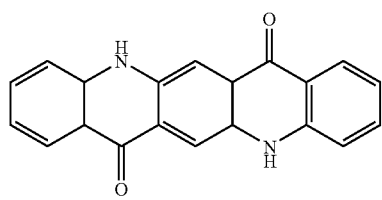

(V-3)
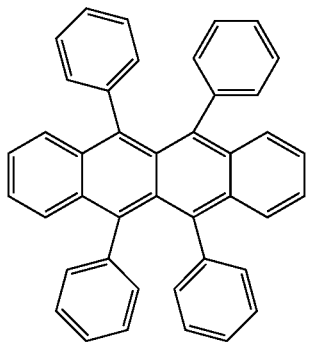

(V-4)
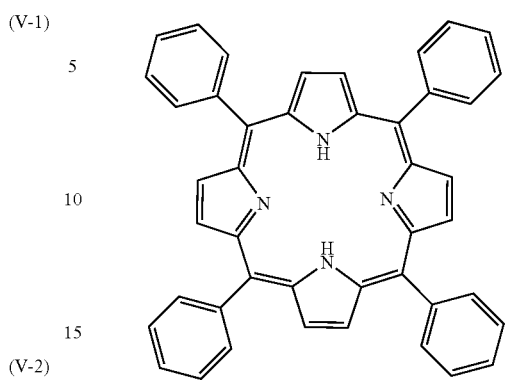

In the organic electroluminescent element shown in FIGS. 1 and 2, the electron transfer layer 5 may be formed only of the aforementioned charge-transferable polyether provided with a function (charge-transferability) according to the purpose. The electron transfer layer 5 may also be formed by mixing and dispersing an electron transfer material other than the charge-transferable polyether in an amount ranging from 0.1% by weight to 50% by weight to control electron mobility for the purposes of, for example, improving luminous efficacy and further improving electron characteristics. Examples of such an electron transfer material include oxadiazole derivatives, nitro-substituted fluorenone derivatives, diphenoquinone derivatives, thiopyran dioxide derivatives and fluorenylidenemethane derivatives. Preferable and specific examples of the electron transfer material include, though not limited to, the following compounds (VI-1) to (VI-3). Similarly to the case of forming the hole transfer layer 3, proper resins and additives may be added. As the resins and additives to be used, those exemplified in the case of forming the hole transfer layer 3 may be applied.

(VI-1)
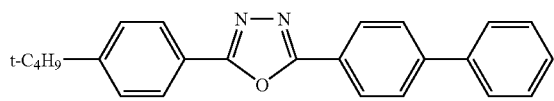

(VI-2)
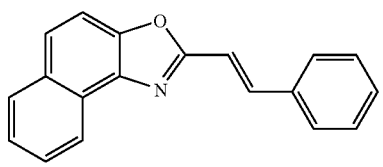

(VI-3)
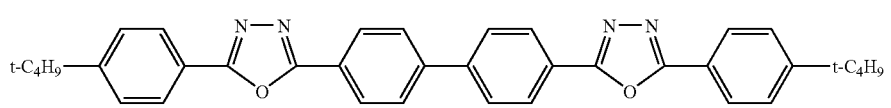

In the organic electroluminescent element shown in FIGS. 3 and 4, the light emitting layer 6 having charge-transferability is an organic compound layer obtained by mixing a light emitting material in a proportion of 50% by weight or less with the aforementioned charge-transferable polyether provided with functions (hole-transferability or electron-transferability) according to the purpose. As this light emitting material, the compounds (IV-1) to (IV-12) are preferably used. Also, an electron transfer material may be compounded in a proportion of 0.1% by weight to 50% by weight in the light emitting layer 6 having charge-transferability to adjust the balance between holes and electrons to be injected into the organic electroluminescent element. As such an electron transfer material, an organic compound having no strong electronic interaction with the aforementioned charge-transferable polyether is preferably used and the following compound (VII) is preferably used; however, the electron transfer material is not limited to these compounds. In order to regulate hole mobility in the same manner as above, a hole transfer material other than the charge-transferable polyether and preferably a proper amount of a tetraphenylenediamine derivative may be used by dispersing it at the same time. Also, like the case of forming the hole transfer layer 3, proper resins and additives may be added. As the reins to be used, those exemplified in the case of the hole transfer layer 3 may be applied. Also, the light emitting layer 6 may be doped with a dye compound differing from the aforementioned light emitting material.

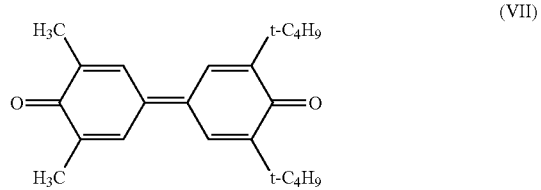

(VII)

In the organic luminescent elements shown in FIGS. 1 to 4, as the backface electrode 7, metals, metal oxides and metal fluorides which can form a thin film by vacuum deposition and have a small work function to inject electrons are used. Examples of the metal include magnesium, aluminum, silver, indium, lithium and calcium, and alloys of these metals. Examples of the metal oxide include lithium oxide, magnesium oxide and aluminum oxide. Also, examples of the metal fluoride include lithium fluoride, magnesium fluoride, strontium fluoride, calcium fluoride and aluminum fluoride. Also, a protective layer (not shown in FIGS.) may be disposed on the surface of the backface electrode 7 to prevent the organic electroluminescent element from being deteriorated by water and oxygen. Specific examples of materials used for the protective layer include metals such as In, Sn, Pb, Au, Cu, Ag and Al, metal oxides such as MgO, $SiO_2$ and $TiO_2$ and resins such as polyethylene resins, polyurea resins and polyimide resins. For the formation of the above protective layer, a vacuum deposition method, sputtering method, plasma polymerization method, CVD method and coating method may be applied.

These organic electroluminescent elements shown in FIGS. 1 to 4 are formed in the following manner. First, the transparent electrode 2 is formed on one surface of the transparent insulator substrate 1. Then, the hole transfer layer 3, the light emitting layer 4, the electron transfer layer 5 and/or the light emitting layer 6 having charge-transferability are formed in this order on the surface of the transparent electrode 2 corresponding to the layer structure of each organic electroluminescent element. Finally, the backface electrode 7 is formed on the surface of the electron transfer layer 5 or of the light emitting layer 6 having charge-transferability, whereby the organic electroluminescent element of the invention is completed.

The hole transfer layer 3, the light emitting layer 4, the electron transfer layer 5 and/or the light emitting layer 6 having charge-transferability are formed as follows. A film of materials constituting each of these layers is formed by a vacuum deposition method and/or by a spin coating method, casting method, dipping method or the like using a coating solution obtained by dissolving or dispersing the materials in a proper organic solvent. The backface electrode 7 is formed by a vacuum deposition method, sputtering method or the like.

Each thickness of the hole transfer layer 3, the light emitting layer 4, the electron transfer layer 5 and the light emitting layer 6 having the charge-transferability is preferably 10 μm or less and particularly preferably in a range from 0.001 μm to 5 μm. When the material constituting each of these layers comprises a mixture of two or more components (for example, a charge-transferable polyether, a light emitting material, and the like), the dispersing state of each material may be a molecule dispersion state that each material is mixed in the state of a molecular level or a fine particle dispersion state wherein other materials are dispersed as fine particles such as microcrystals in a main material. As to the control of the dispersion state in the filming method using a coating solution, a dispersing solvent must be selected in consideration of the dispersibility and solubility of each of the aforementioned materials in order to obtain the molecule dispersion state. On the other hand, to disperse in a fine particle form, a ball mill, a sand mill, a paint shaker, an attritor, a homogenizer and an ultrasonic method may be utilized.

EXAMPLES

The present invention will be explained in more detail by the following examples, which are not intended to be limiting of the invention.

Example 1

Using a glass substrate (soda-lime glass; length: 50 mm, width: 60 mm and thickness: 0.7 mm) as a transparent insulator substrate 1, an ITO film having a thickness of 0.15 μm was formed on one surface of the glass substrate by a sputtering method. Next, this ITO film was patterned using a photomask having a strip-like pattern by photolithography and then subjected to etching treatment to obtain a glass substrate with an ITO electrode in which a strip-like ITO electrode (width: 2 mm and pitch: 14 mm) was formed as a transparent electrode 2 on one surface of the glass substrate. Next, this glass substrate with an ITO electrode was dipped in and washed with a neutral detergent, pure water, acetone (for electronic industry use, manufactured by Kanto kagaku) and isopropanol (for electronic industry use, manufactured by Kanto kagaku) for 10 minutes each with applying ultrasonic waves, followed by drying by a spin coater.

A dichloroethane solution containing 5% by weight of a charge-transferable polyether (exemplified compound (12)) which had been subjected to filtration using a PTFE filter having a pore diameter of 0.1 μm was applied to the surface of the washed and dried glass substrate with an ITO electrode, on which side the ITO electrode was formed, by a dipping method, to form a thin film having a thickness of 0.050 µm as a hole transfer layer 3. The compound (IV-1) was vacuum-deposited as a light emitting material on the surface of the thus formed hole transfer layer 3 to form a 0.065-µm-thick light emitting layer 6 having a charge-transferability. Then, a metal mask with strip-like holes (width: 2 mm and pitch: 10 mm) was placed on the surface of the light emitting layer 6 having charge-transferability so as to make an angle of 90 degree with the strip-like ITO electrode. Finally, a Mg-Ag alloy was deposited under vacuum by co-deposition on the surface on which this mask was placed, to form a 2-mm-wide and 0.15-µm-thick backface electrode 7 on the surface of the light emitting layer 6, thereby obtaining an organic electroluminescent element of Example 1. The resulting electroluminescent element had the same layer structure as the electroluminescent element shown in FIG. 4. The effective area of the light emitting part of the obtained electroluminescent element was 0.04 $cm^2$.

Example 2

The glass substrate with an ITO electrode which was used in Example 1 was washed and dried in the same manner as in Example 1.

A dichloroethane solution containing 10% by weight of a component comprising 1 part by weight of charge-transferable polyether (exemplified compound (12)), 4 parts by weight of poly(N-vinylcarbazole) as a hole transfer material and 1 part by weight of the compound (IV-1) as a light emitting material was prepared. This solution was subjected to filtration using a PTFE filter having a pore diameter of 0.1 µm to thereby obtain a coating solution A. Next, using the coating solution A, a light emitting layer 6 having charge-transferability and a film thickness of about 0.15 µm was formed on the surface of the glass substrate with an ITO electrode, on which side the ITO electrode was formed, by a spin coater method. A Mg-Ag alloy was deposited under vacuum by co-deposition on the surface of the thoroughly dried light emitting layer 6 having charge-transferability by using a metal mask in the same manner as in Example 1, to form a 2-mm-wide and 0.15-µm-thick backface electrode 7, thereby obtaining an organic electroluminescent element of Example 2. This electroluminescent element had the same layer structure as the electroluminescent element shown in FIG. 3. The effective area of the light emitting part of the obtained electroluminescent element was 0.04 $cm^2$.

Example 3

The glass substrate with an ITO electrode which was used in Example 1 was washed and dried in the same manner as in Example 1.

A dichloroethane solution containing 5% by weight of a charge-transferable polyether (exemplified compound (5)) which had been subjected to filtration using a PTFE filter having a pore diameter of 0.1 µm was applied to the surface of the washed and dried glass substrate with an ITO electrode, on which side an ITO electrode was formed, by a dipping method, to form a 0.050-µm-thick thin film as a hole transfer layer 3.

The compound (IV-1) as a light emitting material was vacuum-deposited on the surface of the thus formed hole transfer layer 3 to form a light emitting layer 4 having a thickness of 0.065 µm. Further, on the surface of the light emitting layer 4, the compound (IV-1) was deposited by a vacuum deposition method to form an electron transfer layer 5 having a thickness of 0.030 µm. Next, a Mg—Ag alloy was deposited under vacuum by co-deposition on the surface of the charge transfer layer 5 by using a metal mask in the same manner as in Example 1, to form a 2-mm-wide and 0.15-µm-thick backface electrode 7, thereby obtaining an organic electroluminescent element of Example 3. The resulting electroluminescent element had the same layer structure as the electroluminescent element shown in FIG. 2. The effective area of the light emitting part of the obtained electroluminescent element was 0.04 $cm^2$.

Example 4

An organic electroluminescent element was produced in the same manner as in Example 1 except that the exemplified compound (16) was used in place of the exemplified compound (12) as the charge-transferable polyether for forming the hole transfer layer 3, to thereby obtain an organic electroluminescent element of Example 4 having the same layer structure as the organic electroluminescent element shown in FIG. 4. The effective area of the light emitting part of the obtained electroluminescent element was 0.04 $cm^2$.

Example 5

An organic electroluminescent element was produced in the same manner as in Example 2 except that the exemplified compound (17) was used in place of the exemplified compound (12) as the charge-transferable polyether for forming the hole transfer layer 3, to thereby obtain an organic electroluminescent element of Example 5 having the same layer structure as the organic electroluminescent element shown in FIG. 3. The effective area of the light emitting part of the obtained electroluminescent element was 0.04 $cm^2$.

Example 6

An organic electroluminescent element was produced in the same manner as in Example 3 except that the exemplified compound (22) was used in place of the exemplified compound (12) as the charge-transferable polyether for forming the hole transfer layer 3, to thereby obtain an organic electroluminescent element of Example 6 having the same layer structure as the organic electroluminescent element shown in FIG. 2. The effective area of the light emitting part of the obtained electroluminescent element was 0.04 $cm^2$.

Example 7

An organic electroluminescent element was produced in the same manner as in Example 3 except that the exemplified compound (23) was used in place of the exemplified compound (12) as the charge-transferable polyether for forming the hole transfer layer 3, to thereby obtain an organic electroluminescent element of Example 7 having the same layer structure as the organic electroluminescent element shown in FIG. 2. The effective area of the light emitting part of the obtained electroluminescent element was 0.04 $cm^2$.

Example 8

The glass substrate with an ITO electrode which was used in Example 1 was washed and dried in the same manner as in Example 1.

A dichloroethane solution containing 1.5% by weight of a charge-transferable polyether (exemplified compound (12)) which had been subjected to filtration using a PTFE filter having a pore diameter of 0.1 μm was applied to the surface of the washed and dried glass substrate with an ITO electrode, on which side an ITO electrode was formed, by a dipping method, to form a thin film having a thickness of 0.10 μm as a hole transfer layer 3. The compound (IV-1) as a light emitting material was deposited on the surface of the thus formed hole transfer layer 3 to form a light emitting layer 4 having a thickness of 0.050 μm. Next, a toluene solution containing 3% by weight of a charge transferable polyether (exemplified compound (28)) which had been subjected to filtration using a PTFE filter having a pore diameter of 0.1 μm was applied to the surface of the light emitting layer 4 by a spin coater method, to form a 0.05-μm-thick electron transfer layer 5. Next, a Mg—Ag alloy was deposited under vacuum by co-deposition on the surface of the completely dried electron transferable layer 5 by using a metal mask in the same manner as in Example 1, to form a 2-mm-wide and 0.15-μm-thick backface electrode 7, thereby obtaining an organic electroluminescent element of Example 8. The resulting electroluminescent element had the same layer structure as the electroluminescent element shown in FIG. 2. The effective area of the light emitting part of the obtained electroluminescent element was 0.04 cm².

Comparative Example 1

An organic electroluminescent element was produced in the same manner as in Example 1 except that the compound shown in the following structural formula (VIII) was used in place of the exemplified compound (12) as the charge-transferable polyether for forming the hole transfer layer 3, to thereby obtain an organic electroluminescent element of Comparative Example 1 having the same layer structure as the organic electroluminescent element shown in FIG. 4. The effective area of the light emitting part of the obtained electroluminescent element was 0.04 cm².

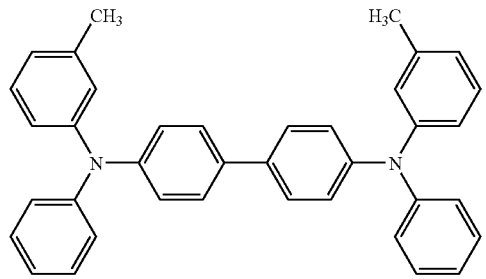

(VIII)

Comparative Example 2

A dichloroethane solution containing 10% by weight of a component comprising 2 parts by weight of polyvinylcarbazole (PVK) as a charge transferable polymer, 0.1 parts by weight of the compound (V-1) as a light emitting material and 1 part by weight of the compound (VI-1) as a charge transfer material was prepared. This solution was subjected to filtration using a PTFE filter having a pore diameter of 0.1 μm to thereby obtain a coating solution B. Next, the coating solution B was applied to the surface of the aforementioned glass substrate with an ITO electrode, on which side an ITO electrode was formed, by a dipping method, to form a hole transfer layer 3 having a film thickness of 0.15 μm. A Mg—Ag alloy was deposited under vacuum by co-deposition on the surface of the thoroughly dried hole transfer layer 3 by using a metal mask in the same manner as in Example 1, to form a 2-mm-wide and 0.15-μm-thick backface electrode 7, thereby obtaining an organic electroluminescent element of Comparative Example 2. The effective area of the light emitting part of the obtained electroluminescent element was 0.04 cm².

(Evaluation)

DC voltage was applied to each of the organic electroluminescent elements of Examples and Comparative Examples, produced in the above manner, under vacuum (133.3×10⁻³ Pa), wherein the ITO electrode side was plus and the Mg—Ag backface electrode side was minus, to emit light, thereby evaluating the maximum luminescence and emitted color. These results are shown in Table 31. Also, the life of the organic electroluminescent element was measured in dry nitrogen. This element life (hour) was defined as the time required until the brightness was decreased to half from the initial value by driving under the constant current set such that the initial brightness was 50 cd/m². The driving current density at this time is shown in Table 31 together with the element life.

The charge-transferable polyether consisting of a repeat unit containing at least one type selected from the structures represented by the general formulae (I-1) and (I-2) as its partial structure has high heat stability when light is emitted. It is also found from the results shown in Table 31 that the organic electroluminescent element using this polyether has large luminous intensity, high luminous efficacy (i.e. low driving current density) and long element life.

Also, since the aforementioned charge-transferable polyether is superior in solubility in and compatibility with a solvent and a resin, the organic electroluminescent element of the invention can be produced using a coating system such as a spin coating method or a dipping method. This shows that the organic electroluminescent element of the invention is superior in terms of productive simplification, processability, area increase, cost and the like.

TABLE 31

| | Maximum brightness cd/m² | Luminous color | Driving current density (mA/m²) | Element life (hour) |
|---|---|---|---|---|
| Example 1 | 620 | Green | 8.3 | 28 |
| Example 2 | 640 | Green | 8.8 | 38 |
| Example 3 | 750 | Red | 9.0 | 24 |
| Example 4 | 855 | Green | 7.5 | 20 |
| Example 5 | 770 | Green | 7.9 | 28 |
| Example 6 | 950 | Green | 6.9 | 31 |
| Example 7 | 820 | Green | 8.2 | 36 |
| Example 8 | 550 | Green | 7.2 | 30 |
| Comparative Example 1 | 480 | Green | 9.5 | 18 |
| Comparative Example 2 | 450 | Red | 9.8 | 15 |

As aforementioned, the invention can provide an organic electroluminescent element which is produced using a charge-transferable polyether superior in heat stability when light is emitted and in solubility in and compatibility with solvents and resins, and which has high luminous intensity, luminous efficacy, has long element life and is easily produced.

What is claimed is:

1. An organic electroluminescent element comprising at least one pair of electrodes comprising an anode and a cathode, at least one of which having light permeability, and one or a plurality of organic compound layers held between the electrodes, wherein at least one organic compound layer contains at least one kind of charge-transferable polyether comprising a repetition unit containing at least one partial structure selected from the group consisting of the following general formulae (I-1) and (I-2):

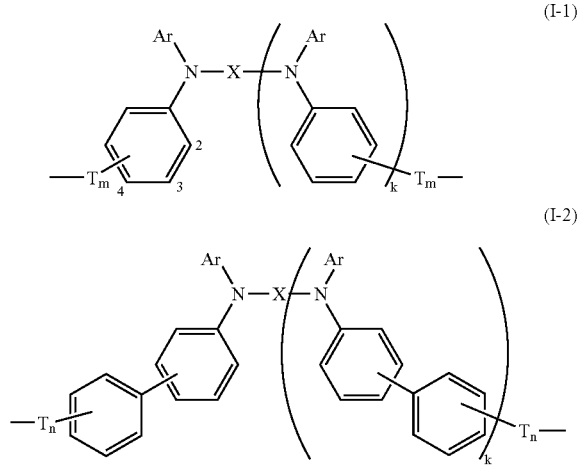

wherein Ar represents one selected from the group consisting of a monovalent benzene ring, a monovalent polynuclear aromatic hydrocarbon, a monovalent condensed aromatic hydrocarbon and a monovalent hetero ring, X represents one selected from the group consisting of a divalent condensed aromatic hydrocarbon, a divalent polynuclear hetero group hydrocarbon, a divalent hetero ring-containing polynuclear aromatic hydrocarbon and a divalent hetero ring-containing condensed aromatic hydrocarbon, T represents a divalent straight-chain hydrocarbon group having 6 to 18 carbon atoms, a divalent unsaturated straight-chain hydrocarbon group having 2 to 5 carbon atoms, or a divalent branched hydrocarbon group having 2 to 30 carbon atoms, m denotes an integer of 0, and k denotes 0 or 1.

2. An organic electroluminescent element according to claim 1, wherein the organic compound layers include at least a light emitting layer and an electron transfer layer, and at least one of the light emitting layer and the electron transfer layer contains at least one kind of charge-transferable polyether comprising a repetition unit containing at least one partial structure selected from the group consisting of the general formulae (I-1) and (I-2).

3. An organic electroluminescent element according to claim 1, wherein the organic compound layers include at least a hole transfer layer, a light emitting layer and an electron transfer layer, and at least one of the hole transfer layer and the electron transfer layer contains at least one kind of charge-transferable polyether comprising a repetition unit containing at least one partial structure selected from the group consisting of the general formulae (I-1) and (I-2).

4. An organic electroluminescent element according to claim 1, wherein the organic compound layers include at least a light emitting layer having charge-transferability and the light emitting layer having charge-transferability contains at least one kind of charge-transferable polyether comprising a repetition unit containing at least one partial structure selected from the group consisting of the general formulae (I-1) and (I-2).

5. An organic electroluminescent element according to claim 1, wherein the organic compound layers include at least a hole transfer layer and a light emitting layer having charge-transferability and at least one of the hole transfer layer and the light emitting layer having charge-transferability contains at least one kind of charge-transferable polyether comprising a repetition unit containing at least one partial structure selected from the group consisting of the general formulae (I-1) and (I-2).

6. An organic electroluminescent element according to claim 4, wherein the light emitting layer having charge-transferability contains a charge-transferable compound other than said charge-transferable polyether.

7. An organic electroluminescent element according to claim 1, wherein the charge-transferable polyether comprising a repetition unit containing at least one, partial structure selected from the group consisting of the general formulae (I-1) and (I-2) is a charge-transferable polyether represented by the following general formula (II):

wherein A represents at least one partial structure selected from the group consisting of the general formulae (I-1) and (I-2), R represents one selected from the group consisting of a hydrogen atom, an alkyl group, an aryl group and an aralkyl group and p denotes an integer from 3 to 5,000.

8. An organic electroluminescent element according to claim 1, wherein Ar represents a monovalent polynuclear aromatic hydrocarbon and the number of the aromatic rings constituting said polynuclear aromatic hydrocarbon is 1 to 3.

9. An organic electroluminescent element according to claim 1, wherein Ar represents a monovalent condensed aromatic hydrocarbon and the number of the aromatic rings constituting said condensed aromatic hydrocarbon is 1 to 3.

10. An organic electroluminescent element according to claim 1, wherein Ar represents a monovalent all-condensed aromatic hydrocarbon.

11. An organic electroluminescent element according to claim 1, wherein Ar represents a monovalent hetero ring and the number of the atoms constituting each cyclic skeleton of the hetero ring is 5 or 6.

12. An organic electroluminescent element according to claim 1, wherein X represents a divalent condensed aromatic hydrocarbon, and the number of the aromatic rings constituting said condensed aromatic hydrocarbon is 2 to 6.

13. An organic electroluminescent element according to claim 1, wherein X represents a partially condensed aromatic hydrocarbon, and the number of the aromatic rings constituting said partially condensed aromatic hydrocarbon is 5 to 6.

14. An organic electroluminescent element according to claim 1, wherein X represents a divalent polynuclear hetero group hydrocarbon, and the number of the hetero rings constituting said polynuclear hetero group hydrocarbon is 2 to 13.

15. An organic electroluminescent element according to claim 14, wherein the hetero rings are bonded straight-chain-wise.

16. An organic electroluminescent element according to claim 1, wherein X represents a divalent hetero ring-containing polynuclear aromatic hydrocarbon, the number of hetero rings is 1 to 11, the number of aromatic rings is 2, and an aromatic ring is bonded with each of both terminals of a divalent polynuclear hydrocarbon in which hetero rings are bonded straight-chain-wise.

17. An organic electroluminescent element according to claim 1, wherein X represents a divalent hetero ring-containing condensed aromatic hydrocarbon, the number of hetero rings is 1 to 5, the number of aromatic rings is 1 to 5, and at least one or more hetero rings and one or more aromatic rings form a condensed cyclic structure.

18. An organic electroluminescent element according to claim 1, wherein the weight average molecular weight Mw of the charge-transferable polyether is in a range from 5000 to 300000.

19. An organic electroluminescent element comprising at least one pair of electrodes comprising an anode and a cathode, at least one of which having light permeability, and one or a plurality of organic compound layers held between the electrodes, wherein at least one organic compound layer contains at least one kind of charge-transferable polyether comprising a repetition unit containing at least one partial structure selected from the group consisting of the following general formulae (I-1) and (I-2):

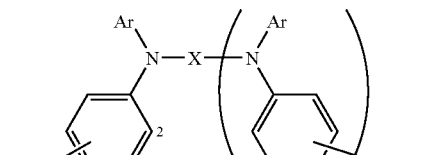
(I-1)

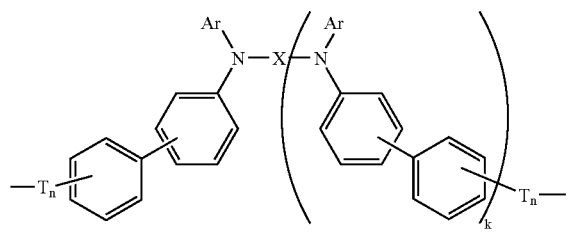
(I-2)

wherein Ar represents one selected from the group consisting of a substituted or non-substituted monovalent benzene ring and a substituted or non-substituted monovalent hetero ring, X represents one selected from the group consisting of a divalent polynuclear aromatic hydrocarbon, a divalent condensed aromatic hydrocarbon, a divalent polynuclear hetero group hydrocarbon, a divalent hetero ring-containing polynuclear aromatic hydrocarbon and a divalent hetero ring-containing condensed aromatic hydrocarbon, T represents a divalent straight-chain hydrocarbon group having 6 to 18 carbon atoms, a divalent unsaturated straight-chain hydrocarbon group having 2 to 5 carbon atoms, or a divalent branched hydrocarbon group having 2 to 30 carbon atoms, m denotes 1, and k denotes 0 or 1.

20. An organic electroluminescent element according to claim 19, wherein the organic compound layers include at least a light emitting layer and an electron transfer layer, and at least one of the light emitting layer and the electron transfer layer contains at least one kind of charge-transferable polyether comprising a repetition unit containing at least one partial structure selected from the group consisting of the general formulae (I-1) and (I-2).

21. An organic electroluminescent element according to claim 19, wherein the organic compound layers include at least a hole transfer layer, a light emitting layer and an electron transfer layer, and at least one of the hole transfer layer and the electron transfer layer contains at least one kind of charge-transferable polyether comprising a repetition unit containing at least one partial structure selected from the group consisting of the general formulae (I-1) and (I-2).

22. An organic electroluminescent element according to claim 19, wherein the organic compound layers include at least a light emitting layer having charge-transferability and the light emitting layer having charge-transferability contains at least one kind of charge-transferable polyether comprising a repetition unit containing at least one partial structure selected from the group consisting of the general formulae (I-1) and (I-2).

23. An organic electroluminescent element according to claim 19, wherein the organic compound layers include at least a hole transfer layer and a light emitting layer having charge-transferability and at least one of the hole transfer layer and the light emitting layer having charge-transferability contains at least one kind of charge-transferable polyether comprising a repetition unit containing at least one partial structure selected from the group consisting of the general formulae (I-1) and (I-2).

24. An organic electroluminescent element according to claim 22, wherein the light emitting layer having charge-transferability contains a charge-transferable compound other than said charge-transferable polyether.

25. An organic electroluminescent element according to claim 19, wherein the charge-transferable polyether comprising a repetition unit containing at least one partial structure selected from the group consisting of the general formulae (I-1) and (I-2) is a charge-transferable polyether represented by the following general formula (II):

$$R—O\text{-}[A—O]_p\text{-}R \quad (II)$$

wherein A represents at least one partial structure selected from the group consisting of the general formulae (I-1) and (I-2), R represents one selected from the group consisting of a hydrogen atom, an alkyl group, an aryl group and an aralkyl group and p denotes an integer from 3 to 5,000.

26. An organic electroluminescent element according to claim 19, wherein Ar represents a monovalent hetero ring and the number of the atoms constituting each cyclic skeleton of the hetero ring is 5 or 6.

27. An organic electroluminescent element according to claim 19, wherein X represents a divalent polynuclear aromatic hydrocarbon, and the number of the aromatic rings constituting said polynuclear aromatic hydrocarbon is 2 to 6.

28. An organic electroluminescent element according to claim 19, wherein X represents a divalent condensed aromatic hydrocarbon, and the number of the aromatic rings constituting said condensed aromatic hydrocarbon is 2 to 6.

29. An organic electroluminescent element according to claim 19, wherein X represents a partially condensed aromatic hydrocarbon, and the number of the aromatic rings constituting said partially condensed aromatic hydrocarbon is 5 to 6.

30. An organic electroluminescent element according to claim 19, wherein X represents a divalent polynuclear hetero group hydrocarbon, and the number of the hetero rings constituting said polynuclear hetero group hydrocarbon is 2 to 13.

31. An organic electroluminescent element according to claim 30, wherein the hetero rings are bonded straight-chain-wise.

32. An organic electroluminescent element according to claim 19, wherein X represents a divalent hetero ring-containing polynuclear aromatic hydrocarbon, the number of hetero rings is 1 to 11, the number of aromatic rings is 2, and an aromatic ring is bonded with each of both terminals of a divalent polynuclear hydrocarbon in which hetero rings are bonded straight-chain-wise.

33. An organic electroluminescent element according to claim 19, wherein X represents a divalent hetero ring-containing condensed aromatic hydrocarbon, the number of hetero rings is 1 to 5, the number of aromatic rings is 1 to 5, and at least one or more hetero rings and one or more aromatic rings form a condensed cyclic structure.

34. An organic electroluminescent element according to claim 19, wherein the weight average molecular weight Mw of the charge-transferable polyether is in a range from 5000 to 300000.

* * * * *